United States Patent
Luo et al.

(10) Patent No.: US 11,476,182 B2
(45) Date of Patent: Oct. 18, 2022

(54) ASSEMBLY OF FLEXIBLE AND INTEGRATED MODULE PACKAGES WITH LEADFRAMES

(71) Applicant: Shenzhen Chipuller Chip Technology Co., LTD, Shenzhen (CN)

(72) Inventors: Zhiquan Luo, Mountain View, CA (US); Jawad Nasrullah, Mountain View, CA (US); Omar Mahmoud Afdal Alnaggar, Mountain View, CA (US)

(73) Assignee: Shenzhen Chipuller Chip Technology Co., LTD, Shenzhen (CN)

( * ) Notice: Subject to any disclaimer, the term of this patent is extended or adjusted under 35 U.S.C. 154(b) by 0 days.

(21) Appl. No.: 16/605,735

(22) PCT Filed: Oct. 8, 2018

(86) PCT No.: PCT/US2018/054885
§ 371 (c)(1),
(2) Date: Oct. 16, 2019

(87) PCT Pub. No.: WO2019/074857
PCT Pub. Date: Apr. 18, 2019

(65) Prior Publication Data
US 2020/0279798 A1     Sep. 3, 2020

Related U.S. Application Data

(60) Provisional application No. 62/570,614, filed on Oct. 10, 2017.

(51) Int. Cl.
*H01L 23/495*     (2006.01)
*H01L 23/31*      (2006.01)

(52) U.S. Cl.
CPC .... *H01L 23/49575* (2013.01); *H01L 23/3107* (2013.01); *H01L 23/49541* (2013.01); *H01L 23/49548* (2013.01)

(58) Field of Classification Search
CPC ........... H01L 23/49575; H01L 23/3107; H01L 23/3121; H01L 23/49541; H01L 23/49548; H01L 25/071
See application file for complete search history.

(56) References Cited

U.S. PATENT DOCUMENTS 6,294,100 B1 *   9/2001   Fan .................... H01L 21/4832
                                                             216/14
10,665,475 B2 *  5/2020   Okamoto ............ H01L 21/561
(Continued)

FOREIGN PATENT DOCUMENTS

KR     1020070047043      5/2007

OTHER PUBLICATIONS

International Search Report & Written Opinion dated Feb. 1, 2019 for PCT Patent Application No. PCT/US2018/054885.
(Continued)

*Primary Examiner* — Mark W Tornow
*Assistant Examiner* — Abbigale A Boyle
(74) *Attorney, Agent, or Firm* — Mughal IP P.C.

(57) ABSTRACT

Described is a packaged component having a first surface and an opposite second surface. The packaged component may comprise a first element a second element, and a third element. The first element may have a first surface and an opposite second surface. The second element may have a first surface and an opposite second surface. The third element may electrically connect a portion of the first element to a portion of the second element. The second surface of the first element may be adjacent to the second surface of the packaged component, and the second surface (Continued)

of the second element may be adjacent to the second surface of the packaged component.

20 Claims, 18 Drawing Sheets

(56) References Cited

U.S. PATENT DOCUMENTS

| | | | |
|---|---|---|---|
| 2005/0012183 | A1 | 1/2005 | Chow et al. |
| 2007/0037320 | A1* | 2/2007 | Mostafazadeh ......... H01L 24/97 |
| | | | 438/108 |
| 2007/0278643 | A1* | 12/2007 | Yee ................... H01L 23/49537 |
| | | | 257/686 |
| 2010/0052131 | A1* | 3/2010 | Tay ......................... H01L 25/03 |
| | | | 257/686 |
| 2011/0127661 | A1* | 6/2011 | Camacho .......... H01L 23/49575 |
| | | | 257/686 |
| 2013/0062783 | A1* | 3/2013 | Lin ................... H01L 23/49565 |
| | | | 257/777 |
| 2014/0013505 | A1 | 4/2014 | Zhao et al. |
| 2014/0103505 | A1 | 4/2014 | Zhao et al. |
| 2015/0364373 | A1* | 12/2015 | Okamoto ................ H01L 24/97 |
| | | | 257/666 |
| 2017/0077018 | A1 | 3/2017 | Desai et al. |

OTHER PUBLICATIONS

International Preliminary Report on Patentability dated Apr. 23, 2020 for PCT Patent Application No. PCT/US218/054885.

* cited by examiner

ASSEMBLY OF FLEXIBLE AND INTEGRATED MODULE PACKAGES WITH LEADFRAMES

CLAIM OF PRIORITY

This application is a National Stage Entry of, and claims priority to, PCT Patent Application No. PCT/US2018/054885, filed Oct. 8, 2018, and titled "Assembly Of Flexible And Integrated Module Packages With Leadframes," which claims the benefit of priority to U.S. Provisional Patent Application Ser. No. 62/570,614, filed on Oct. 10, 2017, titled "Assembly Of Flexible And Integrated Module Packages With Leadframes," and which is incorporated by reference in its entirety for all purposes.

BACKGROUND

Integrated Circuit (IC) package technologies may incorporate specialized silicon and package design layout and architecture and fabrication processes for different packages or products. Electronic components, such as IC chips and passive devices, may be incorporated on a Printed Circuit Board (PCB) along with electrical connections on the PCB board. For applications that require extreme miniaturization, an electronic system built on PCB boards might not be optimal, due to bulk and energy inefficiency.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

Figure 1:
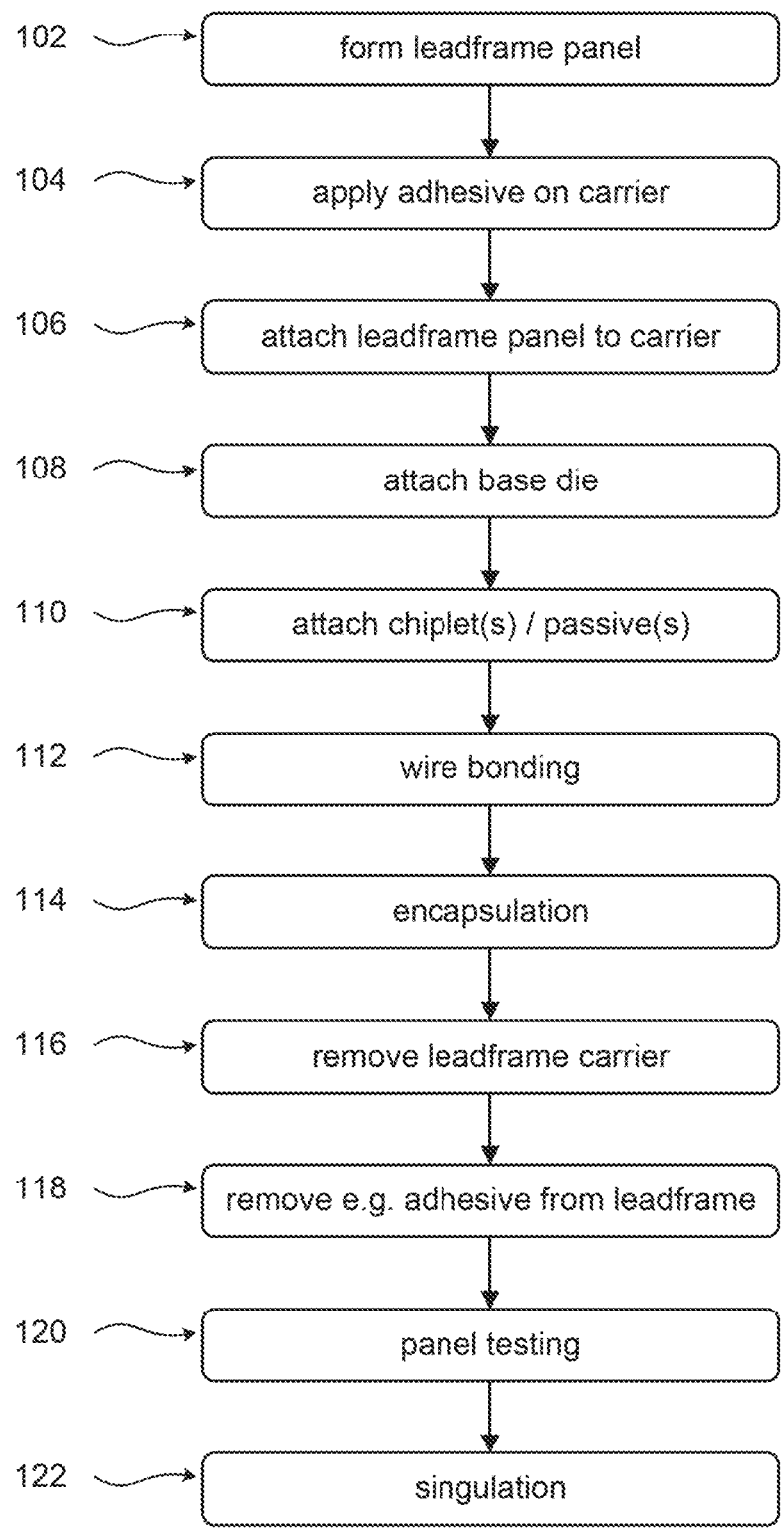
FIG. 1 illustrates a flow diagram for fabricating flexible and integrated module packages with leadframes, in accordance with some embodiments of the disclosure.

Integrated Circuit (IC) chips and passives (e.g., passive devices) may be incorporated on a Printed Circuit Board (PCB). Electronic systems built on PCB boards might not be optimal, due to their bulk and energy inefficiency. Meanwhile, new and emerging IC package technologies may provide assembly methods for integrating multiple electronic components into a single device that may be achieved by some combination of specialized silicon designs, substrate designs, or package designs. These methods may be customized for specific products that may be associated with expensive and long-lead-time silicon design and development, or expensive and long-lead-time substrate design and manufacturing.

Disclosed herein are flexible mechanisms and assembly methods to support the integration of various electronic components into one packaged module. These mechanisms and methods may reduce or eliminate additional time or cost for repeated engineering design and development, while retaining miniaturization and performance targets. Accordingly, the disclosed mechanisms and methods may facilitate production of flexible, multi-chip packaged module for applications with rapid prototyping and mass-production cycle times.

Various methods, systems, and apparatuses described herein pertain to the assembly of packaged modules with leadframes. A leadframe panel may be formed to include a plurality of leads and/or pockets or die pads for packaged modules. The leadframe panel may be attached to, for example, a leadframe carrier, and base chips may be attached into pockets of the leadframe (or onto die pads). One or more electronic components, which may be small ICs or passive devices, may be attached to each of the base chips. Connections between the base chips and the leads may be made by wire bonding or similar methods. The leadframe and components may then be encapsulated with molding compound after wire bonding. The leadframe carrier may be detached from the encapsulated leadframe and components to form a panel of molded and assembled packaged modules. The panel may then be processed (e.g., singulated) to separate the plurality of packaged modules. Each packaged module may accordingly include at least one of the base chips, one or more electronic components, and leads that are molded together.

In another type of application, flexible chip carriers may be built by open cavity molding, followed by wire bonding connections between base chips and leads. The bonding wires may be encapsulated by additional materials (e.g., glob-top materials) or through similar technologies. An leadframe panel of open cavity packaged modules may be either processed into a plurality of packaged modules (e.g., singulated) or delivered as panels for subsequent assembly operations, which may include attachment of one or more electronic components (e.g., ICs or passive devices) to each of the base chips inside the open cavity, followed by lid attachment or encapsulation. Each packaged module may accordingly include at least one of the base chips, one or more electronic components, and leads.

A base chip assembled in the packaged module may provide a common base for flexible attachment of electronic components with different footprints, dimensions, and functionalities, and may satisfy various different system and/or customer needs with different applications. The components may be physically connected to the base chip in a face-to-face bonding process, and the base chip may be connected to package leads by wire bonding. The base chip may be designed and fabricated with programmable attachment slots reserved for components including application processors, memories, sensors, radio frequency (RF) circuitries, and so on. Due to the programmability of the base chip, an actual routing scheme may be adjusted based on an actual footprint of components, which may advantageously facilitate or allow proper connection and integration of components into a highly integrated multi-chip packaged modules without requiring specialized silicon or substrate design. The disclosed mechanisms and methods may accordingly incorporate leadframes that utilize base chip programmability and package flexibility for minimized package development cost and lead time.

While some embodiments may comprise no-lead leadframe packages, other embodiments might not comprise no-lead leadframe packages. Various embodiments may pertain to packaged modules with various types and shapes of leads. In some embodiments, packaged modules without die pads may advantageously accommodate reduced package height (e.g., z-dimensions) and/or enhanced thermal performance, due to elimination of ball grid array (BGA) portions and/or substrate portions.

For some embodiments, a packaged module may also utilize die pads as a variety of leadframe package technologies. A base chip may be attached on a die pad, and electronic components may be integrated on the base chip in a manner substantially similar to the methods described herein.

Accordingly, various assembly methods and processes described herein may provide flexible IC packaging that may reduce engineering development time and cost, and may enable highly integrated modules for various applications.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

As described herein, various examples and specific details are set forth in order to provide a thorough understanding of the invention for purposes of explanation. However, a skilled person in the art may include some of the features in these examples alone or in combination with other features described herein, and may further include various modifications and equivalents of the features and concepts described herein. It is also pointed out that those elements of the figures (or scenarios) having the same names or reference numbers as the elements of any of the other figures (or scenarios) may be the same as those elements (e.g., may operate or function in any manner similar to that described), but are not limited to such.

FIG. 1 illustrates a flow diagram for fabricating flexible and integrated module packages with leadframes, in accordance with some embodiments of the disclosure. In various embodiments, a method 100 may comprise a forming portion 102, an applying portion 104, an attaching portion 106, an attaching portion 108, an attaching portion 110, a bonding portion 112, an encapsulating portion 114, a removing portion 116, a removing portion 118, a testing portion 120, and/or a singulating portion 122. Various figures herein may comprise illustrative diagrams for further description of portions of method 100 to which they are related.

In forming portion 102, a leadframe panel may be formed. In applying portion 104, an adhesive may be applied on a carrier. In attaching portion 106, the leadframe panel may be attached to the carrier. In attaching portion 108, a base die may be attached (e.g., to the adhesive).

In attaching portion 110, one or more IC components and/or passive devices may be attached (e.g., to the base die). In bonding portion 112, a wire may be bonded (e.g., to leads of the leadframe panel and/or to pads on the base die). In encapsulating portion 114, the leads of the leadframe panel, the base die, the one or more IC components and/or passive devices, and/or the wire may be encapsulated (e.g., with a molding compound) to form packaged modules. In removing portion 116, the leadframe carrier may be removed from the leadframe panel.

In removing portion 118, the adhesive may be removed from portions of the leadframe panel. In testing portion 120, the encapsulated packaged modules may be tested. In singulating portion 122, the encapsulated packaged modules may be singulated (e.g., processed and/or separated into a plurality of packaged modules).

Figure 2:
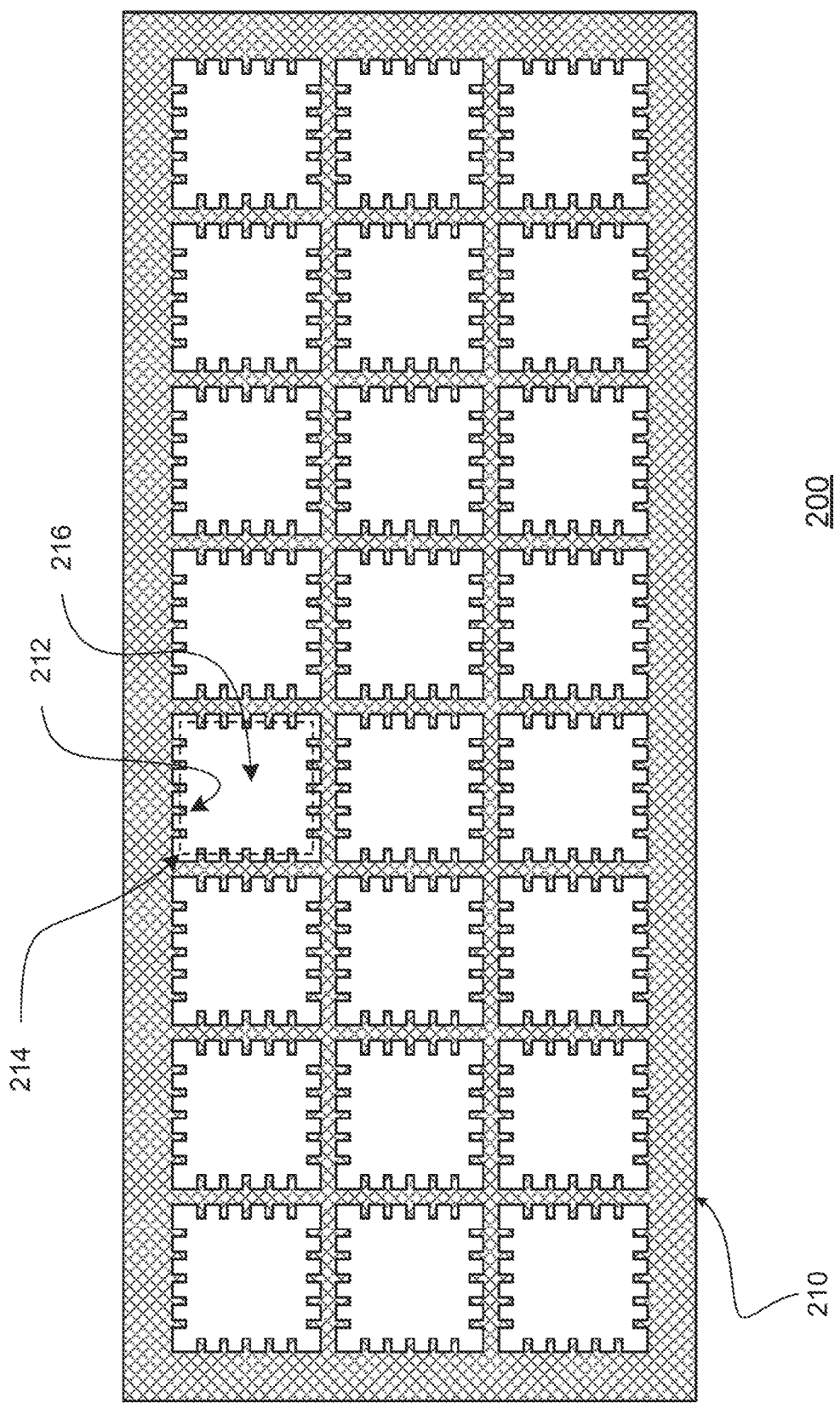
FIG. 2 illustrates a top view of a pre-fabricated leadframe panel, in accordance with some embodiments of the disclosure.

FIG. 2 illustrates a top view of a pre-fabricated leadframe panel, in accordance with some embodiments of the disclosure. In a scenario 200, a leadframe panel 210 may be formed from a thin metal sheet by stamping, by chemical etching, or by another method (e.g., in forming portion 102). The metal sheet may be made of, or may include, a copper alloy or other suitable materials (e.g., materials having physical and/or electrical properties similar to a copper alloy). A thickness of the metal sheet, and thus a thickness of the leadframe panel, may vary as appropriate for different applications.

Leadframe panel 210 may include a plurality of pockets 216 (depicted as an area enclosed by a dashed rectangle). A peripheral region of a pocket 216 may be adjacent to and/or may include a plurality of leads 212 extending from leadframe panel 210, and a central region of the pocket 216 may correspond with an empty hole 214 for chip attachment. (In some embodiments, empty holes 214 may accommodate die pads as disclosed herein.) Leads 212 may be of different sizes, shapes, and/or pitches, as appropriate for different applications. A total quantity and a layout of leads 212 may also vary as appropriate for different applications. In various embodiments, pockets 216 may correspond to separate packaged modules after completion of the methods disclosed herein.

Figure 3:
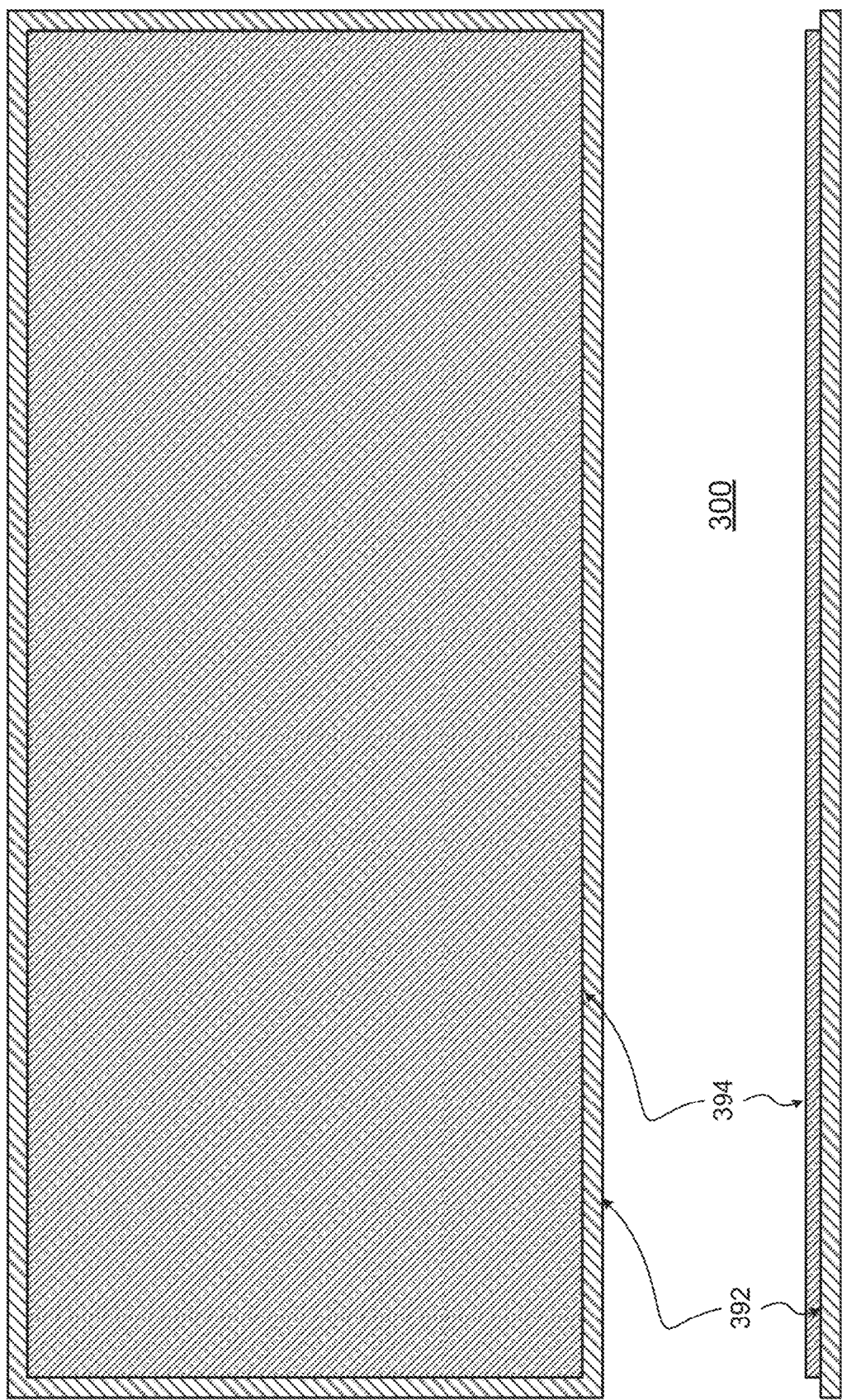
FIG. 3 illustrates a diagram of a leadframe carrier with adhesives, in accordance with some embodiments of the disclosure.

FIG. 3 illustrates a diagram of a leadframe carrier with adhesives, in accordance with some embodiments of the disclosure. In a scenario 300, a carrier 392 may have an adhesive 394 applied thereto (e.g., in applying portion 104). A flat metal plate or similar material may be used as carrier 392. A thickness and/or a size of carrier 392 may vary according to leadframe panel size and process components. Adhesive 394 may be a thin layer applied on a top surface of carrier 392 to hold a leadframe panel on the carrier. Alternatively, in some embodiments, an adhesive may be applied on a bottom of a leadframe panel prior to being attached to carrier 392.

Figure 4:
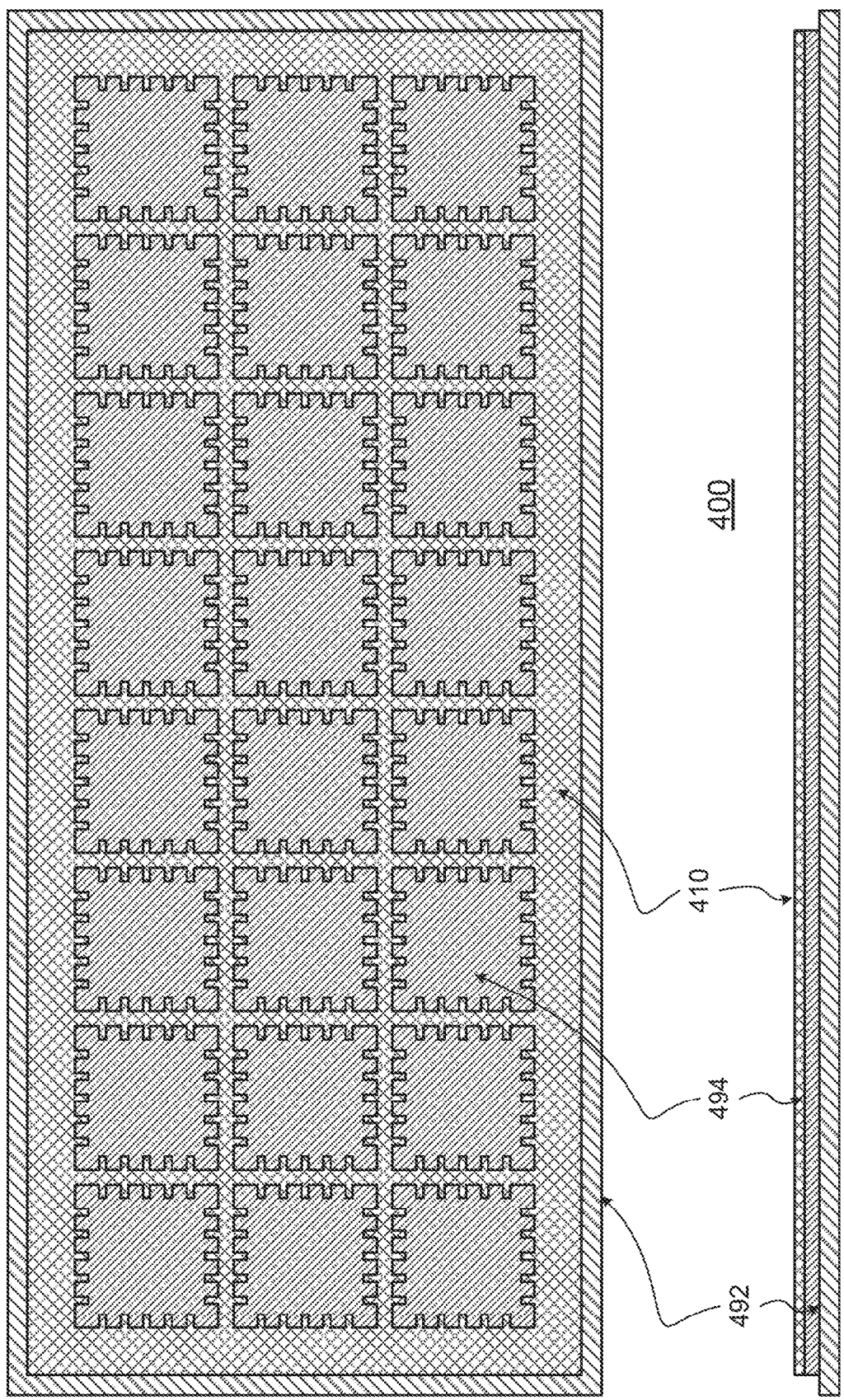
FIG. 4 illustrates a top view and a cross-sectional view of a leadframe panel on a leadframe carrier, in accordance with some embodiments of the disclosure.

FIG. 4 illustrates a top view and a cross-sectional view of a leadframe panel on a leadframe carrier, in accordance with some embodiments of the disclosure. In a scenario 400, leadframe panel 410 may be attached via an adhesive 494 to a carrier 492 (e.g., in attaching portion 106).

Figure 5A:
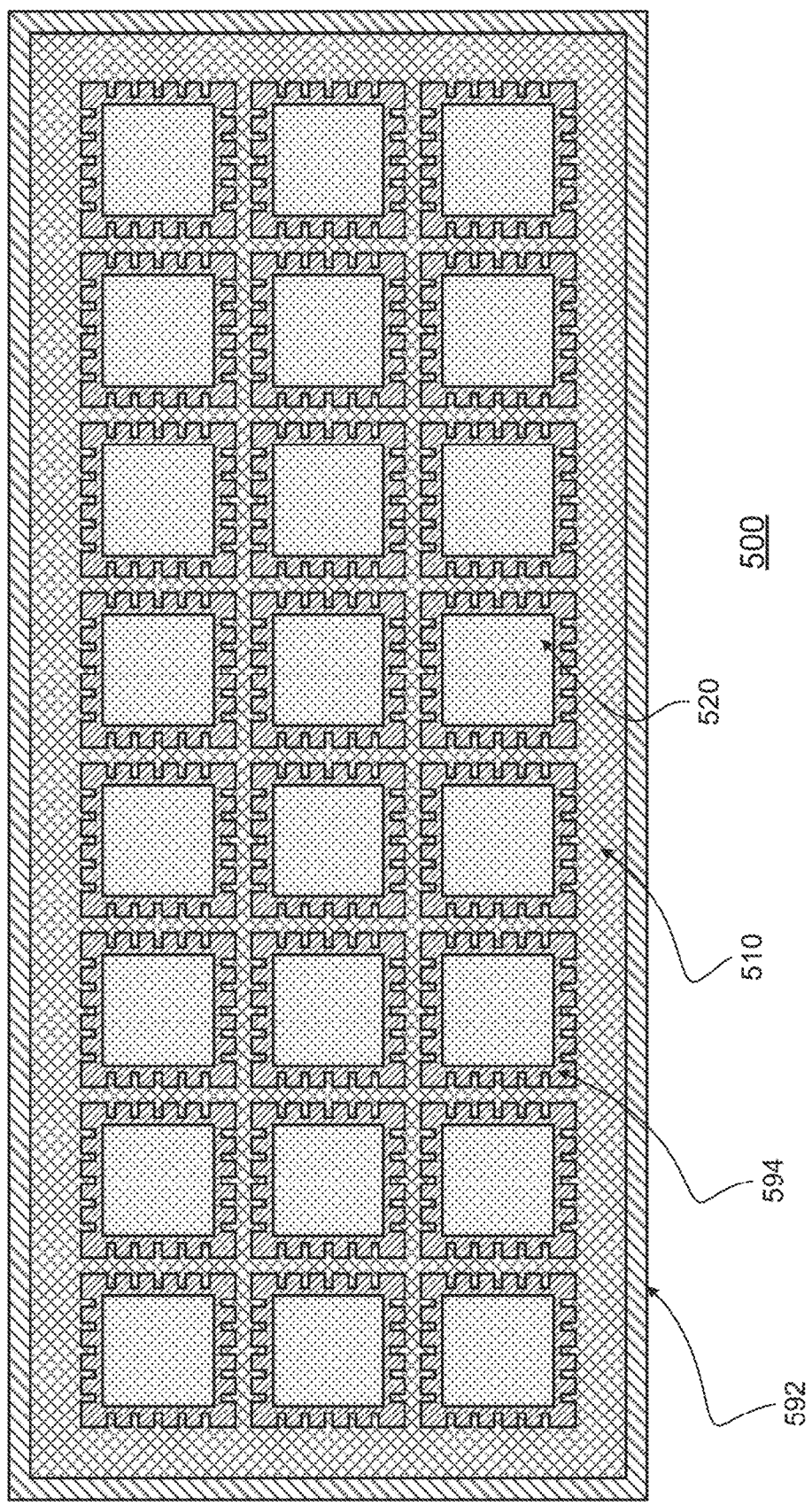
FIGS. 5A and 5B illustrate a top view and a cross-sectional view, respectively, of base chips attached onto base chip attachment areas of a leadframe panel, in accordance with some embodiments of the disclosure.
Figure 5B:
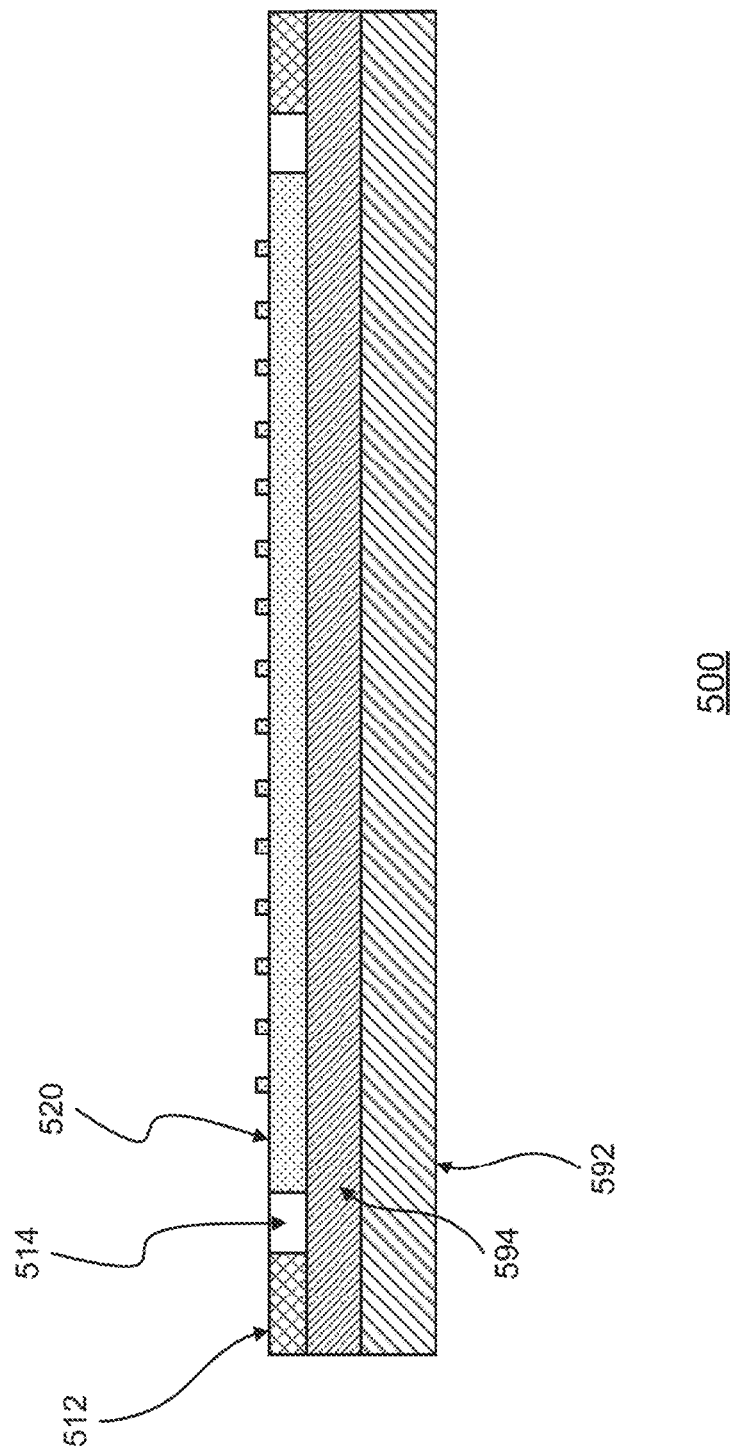

FIGS. 5A and 5B illustrate a top view and a cross-sectional view, respectively, of base chips attached onto base chip attachment areas of a leadframe panel, in accordance with some embodiments of the disclosure. In a scenario 500, one or more base chips 520 may be attached into corresponding empty holes 514 of leadframe panel 510 (e.g., in attaching portion 108). For example, a base chip 520 may be attached through empty hole 514 of each pocket of leadframe panel 510. Base chips 520 may be attached to carrier 592 by adhesive 594. Meanwhile, leads 512 at the peripheral regions of the pockets may be separated from (e.g., not in contact with) base chips 520.

Base chips 520 may be, or may include, programmable silicon interposers. In various embodiments, the programmable silicon interposers may be, or may include, an integrated circuit.

Base chips 520 could be replaced by substrates, PCBs, or alternative silicon dies, which might be custom-designed due to changes coming from any of the sizes, footprints, or quantities of the IC components to be integrated in the system. However, the cost and time of doing so may be significant for the engineering work necessitated by the custom design and fabrication process. In contrast, the architecture of the base chip 520 as described herein may advantageously render unnecessary such changes in base chip design to accommodate IC components, which may in turn reduce engineering work (and the associated cost and time).

Figure 6A:
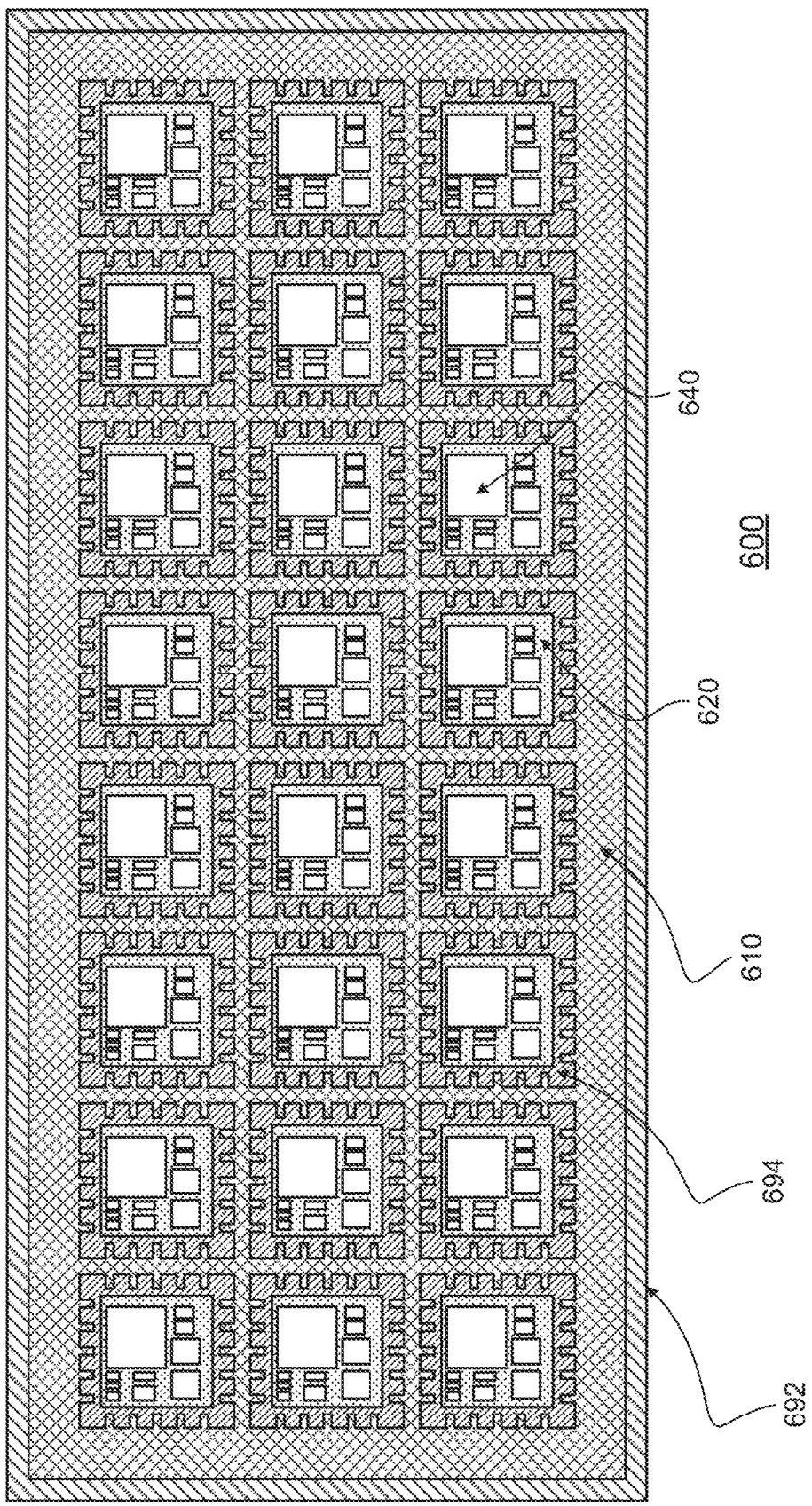
FIGS. 6A and 6B illustrate a top view and a cross-sectional view, respectively, of Integrated Circuit (IC) components and passive devices attached onto a base chip, in accordance with some embodiments of the disclosure.
Figure 6B:
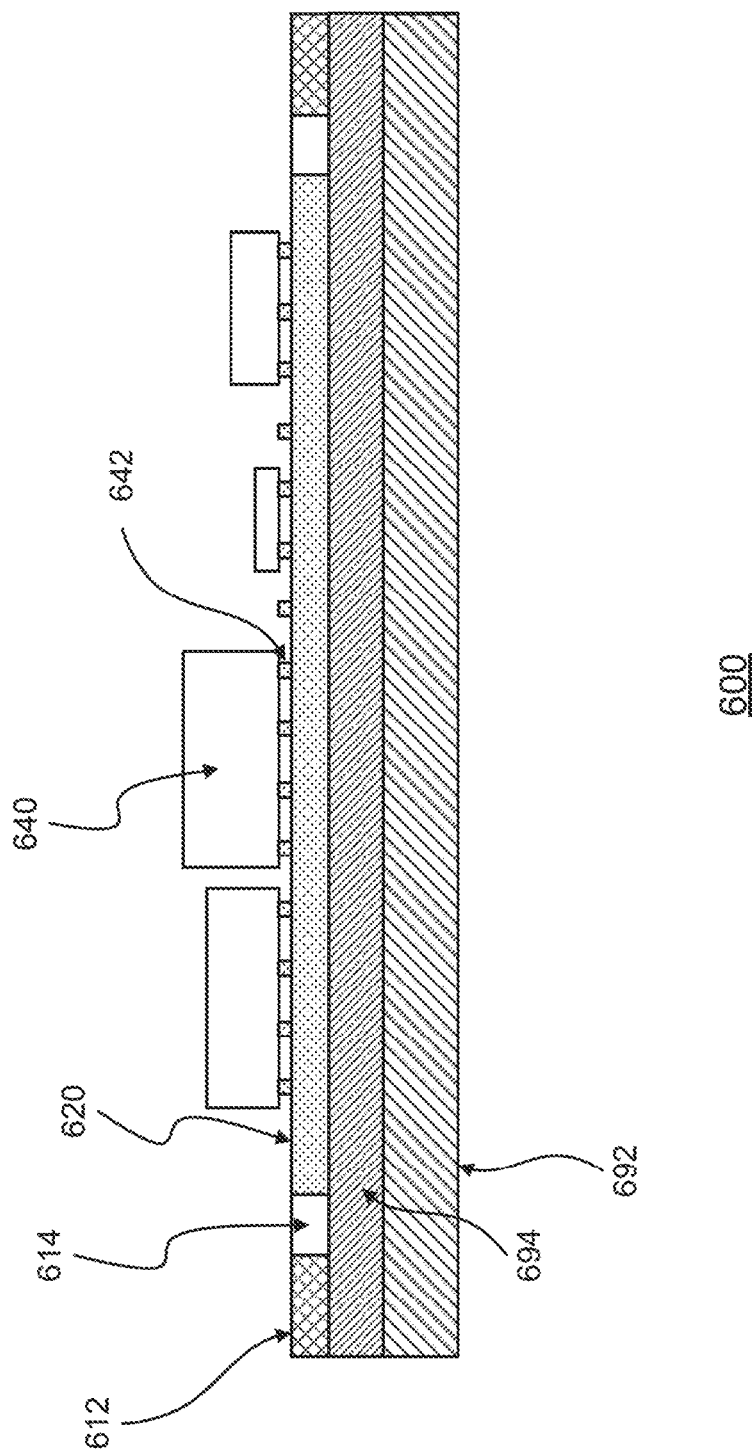

FIGS. 6A and 6B illustrate a top view and a cross-sectional view, respectively, of ICs and passive devices attached onto a base chip, in accordance with some embodiments of the disclosure. FIGS. 6A and 6B may depict exemplary package layouts after IC component attachment. In a scenario 600, a leadframe panel 610 may be attached via an adhesive 694 to a carrier 692, and base chips 620 may also be attached (through empty holes 614) to carrier 692 by adhesive 694. Leads 612 at the peripheral regions of pockets of leadframe panel 610 may be separated from (e.g., not in contact with) base chips 620.

One or more IC components 640 may then be populated on base chips 620 (e.g., in attaching portion 110). The connections between base chips 620 and IC components 640 may be made by a face-to-face bonding 642. IC components 640 may be "chiplets" which may be, or may include, semiconductor dies, integrated circuits, and/or semiconductor chips. IC components 640 may be application processors, memories, sensors, passive devices, or other types of components, based on system needs.

In some embodiments, different IC components may have different sizes. Although the components may be different, they may be integrated on the same base chip (if they can physically fit into the designated areas). Various IC components 640 may accordingly be attached to base chips 620 through pockets of leadframe panel 610. Accordingly, in addition to the flexibility to integrate various components on the same base chip, engineering work to develop a fabrication process flow in accordance with the methods disclosed herein may be minimal.

Figure 7:
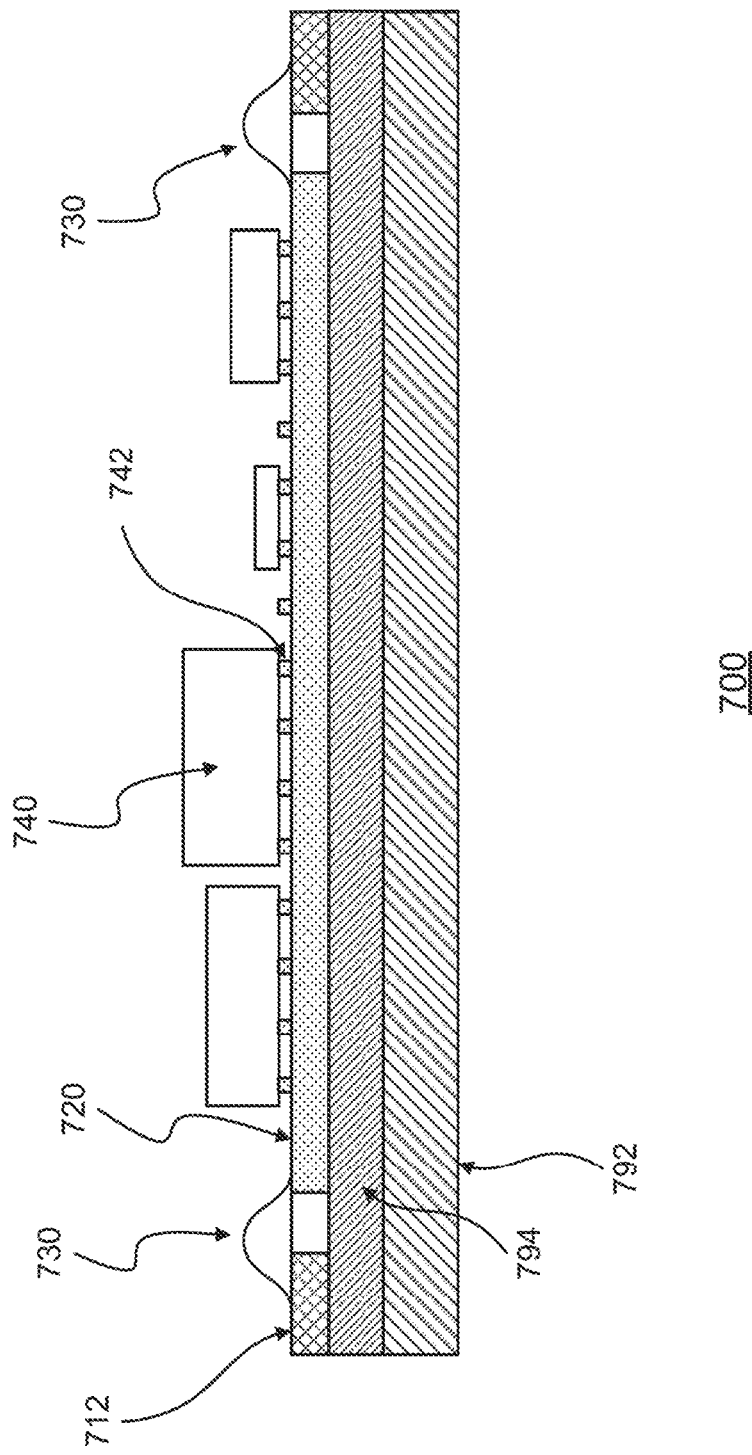
FIG. 7 illustrates a cross-sectional view of a wire bonding to connect a base chip and leads, in accordance with some embodiments of the disclosure.

FIG. 7 illustrates a cross-sectional view of a wire bonding to connect a base chip and leads, in accordance with some embodiments of the disclosure. In a scenario 700, a leadframe panel may be attached via an adhesive 794 to a carrier 792, and base chips 720 may also be attached (through empty holes of the leadframe panel) to carrier 792 by adhesive 794. One or more leads 712 at peripheral regions of pockets of leadframe panel 710 may be separated from (e.g., not in contact with) base chips 720, and one or more IC components 740 may be populated on base chips 720.

Base chips 720 may be connected to leads 712 by bonding wires 730 (e.g., in bonding portion 112). Bonding wires 730 may extend between pads on base chips 720 (which may provide electrical connection to circuitries on base chips 720) and pads on leads 712. Bonding wires 730 may be made of conductive materials, such as gold or copper or other suitable materials. Portions of base chips 720 may accordingly be electrically connected to leads 712 by bonding wires 730.

Figure 8A:
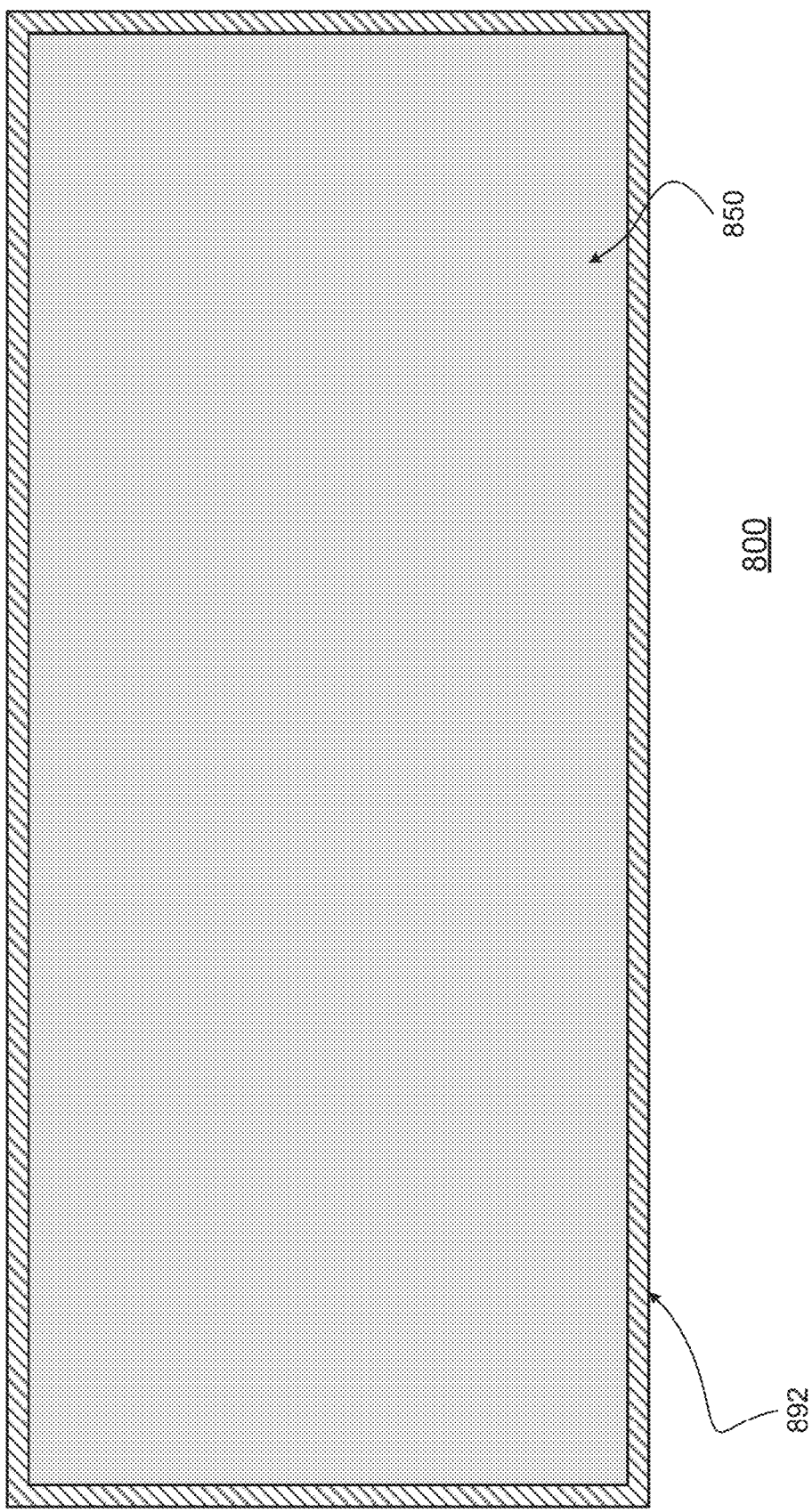
FIGS. 8A and 8B illustrate a top view and a cross-sectional view, respectively, of encapsulation on a leadframe panel, in accordance with some embodiments of the disclosure.
Figure 8B:
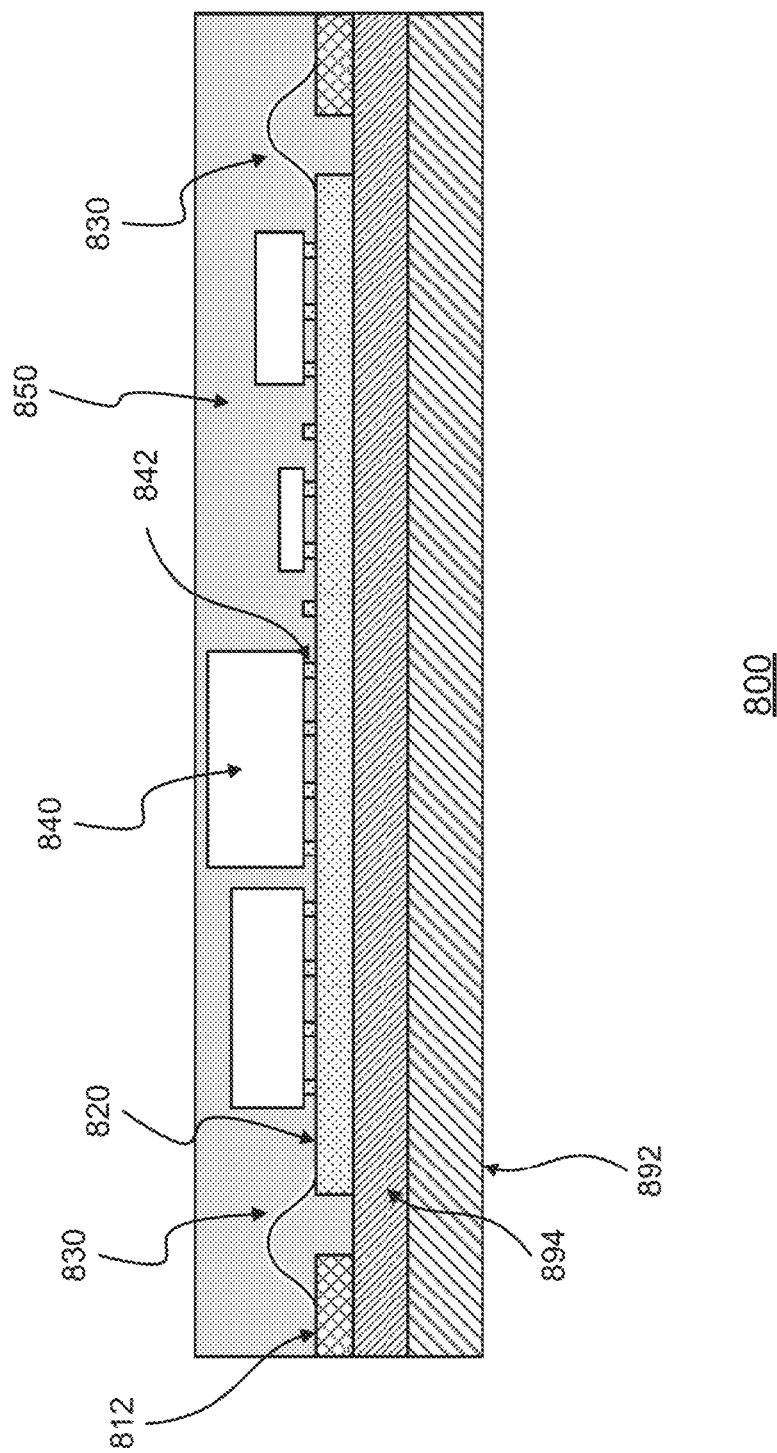

FIGS. 8A and 8B illustrate a top view and a cross-sectional view, respectively, of encapsulation on a leadframe panel, in accordance with some embodiments of the disclosure. In scenario 800, a leadframe panel may be attached via an adhesive 894 to a carrier 892, and base chips 820 may also be attached to carrier 892 by adhesive 894. One or more leads 812 at peripheral regions of pockets of the leadframe panel may be separated from base chips 820, one or more IC components 840 may be populated on base chips 820, and base chips 820 may be connected to leads 812 by bonding wires 830.

Furthermore, various elements such as leads 812, base chips 820, IC components 840, and bonding wires 830 may be encapsulated (e.g., in encapsulating portion 114). The encapsulation may provide protection to those elements (including to bonding wires 830). The encapsulation material may be a molding compound 850 (which may be, e.g., an epoxy material). Accordingly, in various embodiments, all the leads and all the components may be encapsulated.

Following encapsulation, molding compound 850 may fill in spaces between leads 812 and base chips 820, and may provide mechanical support to hold them together. The molding compound may also fill in the space around bonding wires 830 to enhance a bonding strength. In some embodiments, underfill materials may also be applied to advantageously further enhance the bonding strength.

In some embodiments, some components (e.g., parts of base chips 820 and/or IC components 840) may be exposed by partial encapsulation, based on the packaging system requirements.

Carrier 892 (e.g., a leadframe carrier) may be removed from a leadframe panel (e.g., in removing portion 116), and adhesive 894 may be removed from the leadframe panel (e.g., in removing portion 118). This may leave base chips 820 and IC components 840 encapsulated and held by molding compound 850 to form a panel of packaged modules.

Finishing operations on the fabricated packaged modules may then be performed. A testing may verify that the connections (e.g., electrical connections) have been properly made between leads 812, base chips 820, and IC components 840 (e.g., in testing portion 120).

A singulating may process and/or separate the encapsulated packaged modules (e.g., in singulating portion 122). During singulation, the leadframe panel may be separated into individual encapsulated packaged modules. The singulation process may be done by mechanical sawing, punching, or similar techniques. Each pocket of the leadframe panel may thereby be separated into a single packaged module.

In some embodiments, a reconfiguration process on base chips 820 may be performed, either prior to singulation or after singulation, to fully enable the coupling of base chips 820 and IC components 840.

Figure 9:
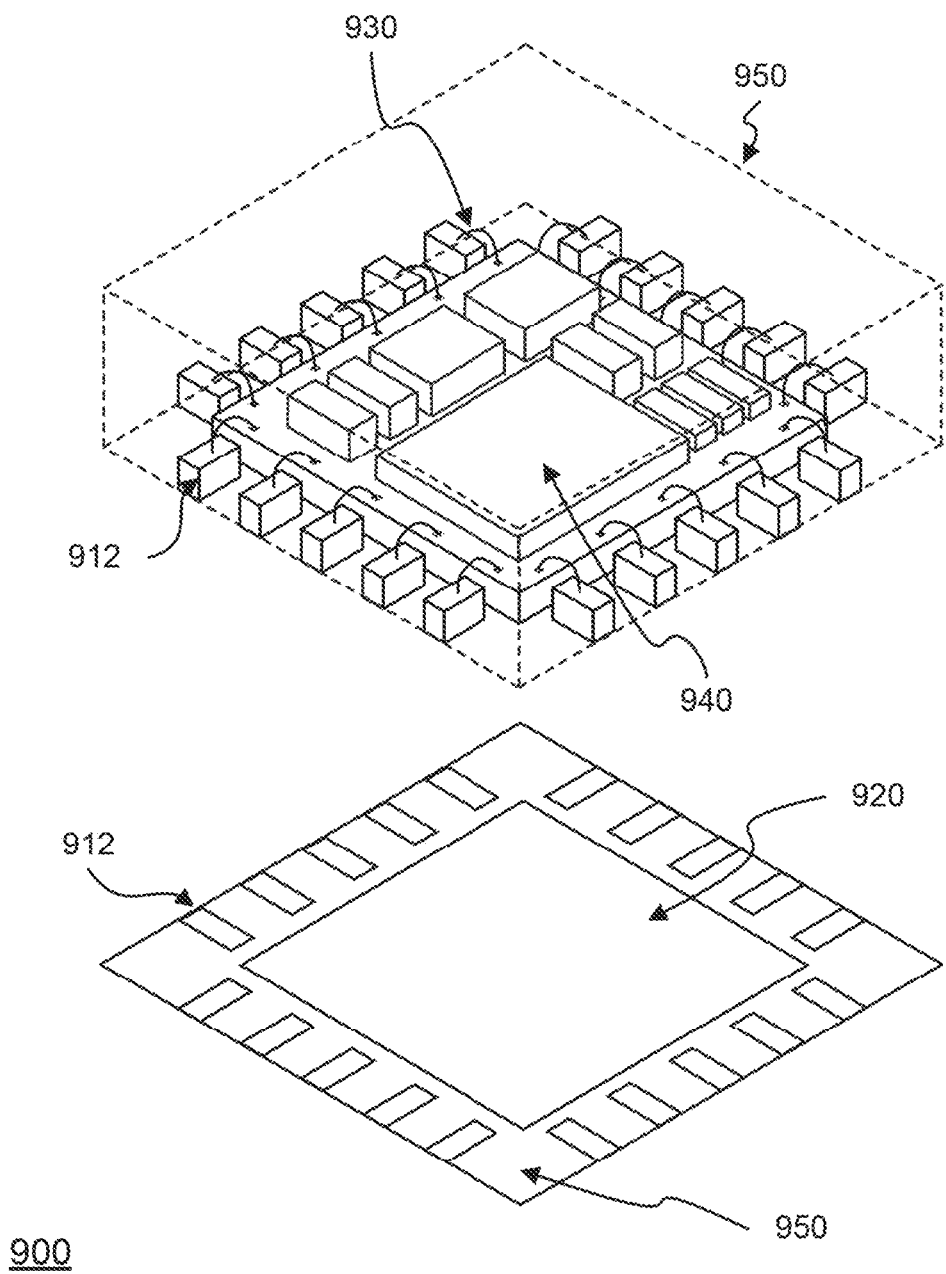
FIG. 9 illustrates an exploded perspective view of a package separated from a panel, in accordance with some embodiments of the disclosure.

FIG. 9 illustrates an exploded perspective view of a package separated from a panel, in accordance with some embodiments of the disclosure. FIG. 9 depicts an assembled packaged module showing package leads and a bottom side of a base chip encapsulated by mold. In a scenario 900, an encapsulating molding compound 950 may hold the assembled packaged module together, including leads 912, base chip 920, IC components 940, and bonding wires 930. The encapsulating molding compound 950 may provide mechanical support and/or protection from external impacts, especially impacts to bonding wire 930 that might cause broken wires or electric shorting, as well as protection from other quality and reliability issues.

Figure 10:
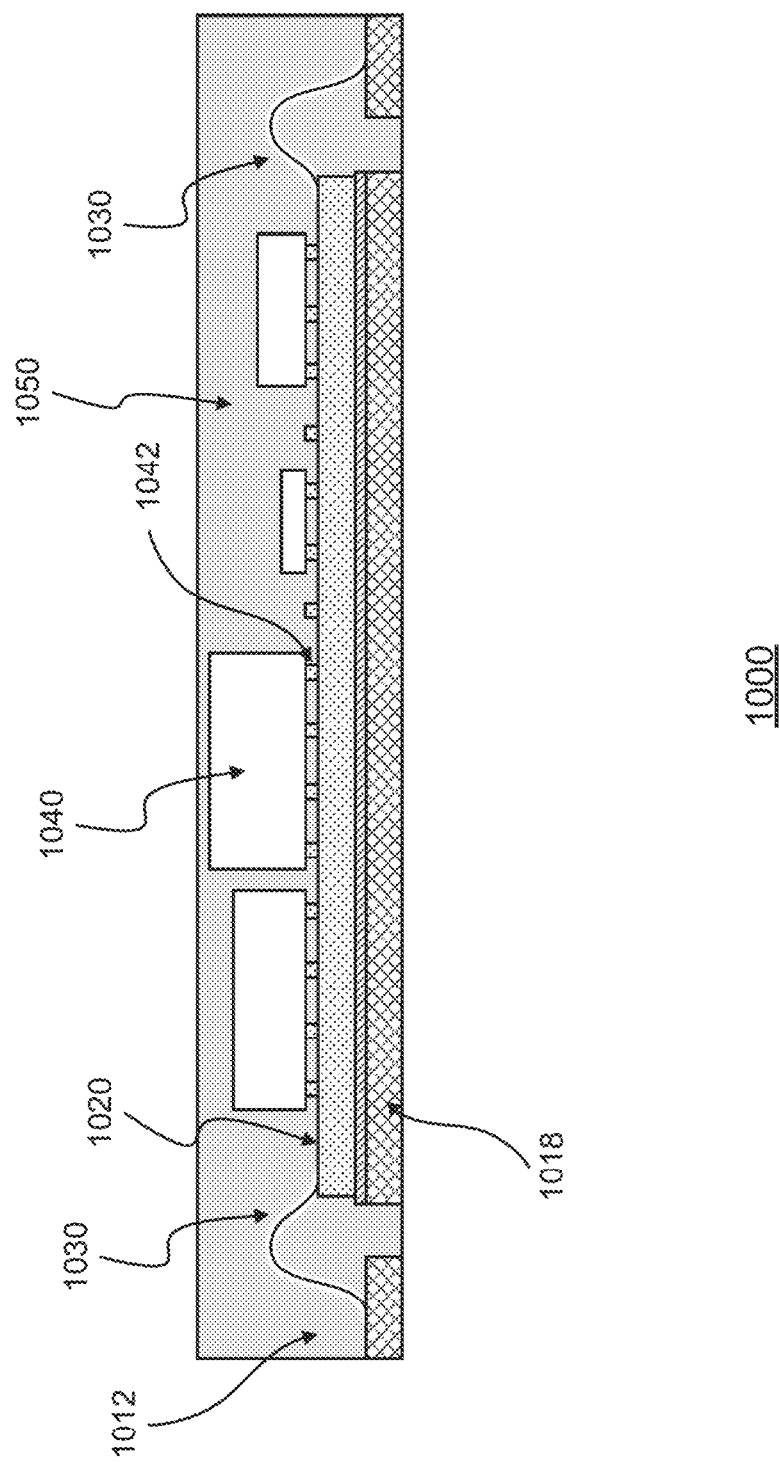
FIG. 10 illustrates a cross-sectional view of a package, in accordance with some embodiments of the disclosure.

FIG. 10 illustrates a cross-sectional view of a package, in accordance with some embodiments of the disclosure. In a scenario 1000, for some alternate embodiments, a base chip 1020 may be attached to a die pad 1018, and exposure of the bottom of base chip 1020 might thereby be advantageously avoided. For example, a package may comprise a die pad 1018 to support attachment of base chip 1020 (e.g., via an adhesive). In some embodiments, die pad 1018 may be a portion of a leadframe panel also used to form various leads 1012. Base chip 1020 may be connected to leads 1012 by various bonding wires 1030. A molding compound 1050 may also provide substantially similar encapsulation.

As a result of the package configuration changes, the fabrication process flow (e.g., method 100) may be adjusted accordingly. However, the packaging methodology may have substantially similar design and/or fabrication flexibility as other methodologies discussed herein, and may serve the same foundation for the integration of various IC components 1040 within packaged modules.

Figure 11:
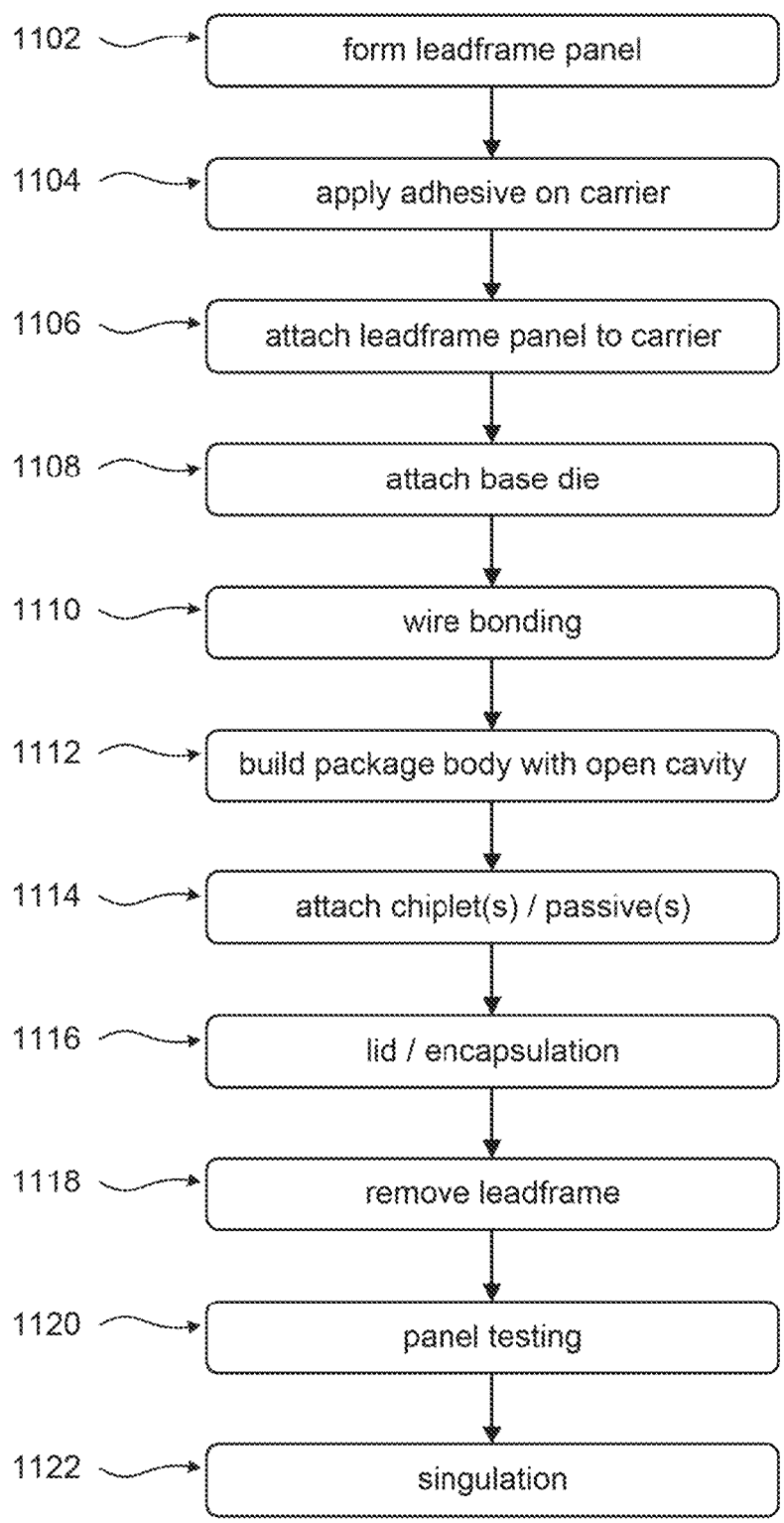
FIG. 11 illustrates a flow diagram for fabricating flexible IC carrier packages with leadframes, in accordance with some embodiments of the disclosure.

FIG. 11 illustrates a flow diagram for fabricating flexible IC carrier packages with leadframes, in accordance with some embodiments of the disclosure. In various embodiments, a method 1100 may comprise a forming portion 1102, an applying portion 1104, an attaching portion 1106, an attaching portion 1108, a bonding portion 1110, a building portion 1112, an attaching portion 1114, an encapsulating portion 1116, a removing portion 1118, a testing portion 1120, and/or a singulating portion 1122.

Various portions of method 1100 may be substantially similar to portions of method 100. In contrast with method 100, bonding portion 1110, building portion 1112, attaching portion 1114, and encapsulating portion 1116 of method 1100 may differ from method 1100.

In bonding portion 1110, a wire may be bonded (e.g., to leads of a leadframe panel and/or to pads on a base die). In building portion 1112, a package body with an open cavity may be built (e.g., a base die having an exposed surface, as discussed further herein), such as by encapsulating leads of the leadframe panel, bonding wires, and/or peripheral portions of the base die with a molding compound. In attaching portion 1114, one or more IC components and/or passive devices may be attached (e.g., to the partially-encapsulated base die). In encapsulating portion 1116, remaining portions of the base die as well as the one or more IC components and/or passive devices may be encapsulated (e.g., with a "lid" portion of a molding compound) to form packaged modules. Moreover, in removing portion 1118, both the leadframe carrier and the adhesive may be removed (e.g., from the leadframe panel).

Accordingly, a flexible IC carrier may also be realized by variations of the method of FIG. 1. In comparison with method 100, in method 1100, IC components and/or passive devices might not be attached until wire bonding has occurred (e.g., in bonding portion 1110) and partial encapsulation has been completed (e.g., in building portion 1112).

Figure 12:
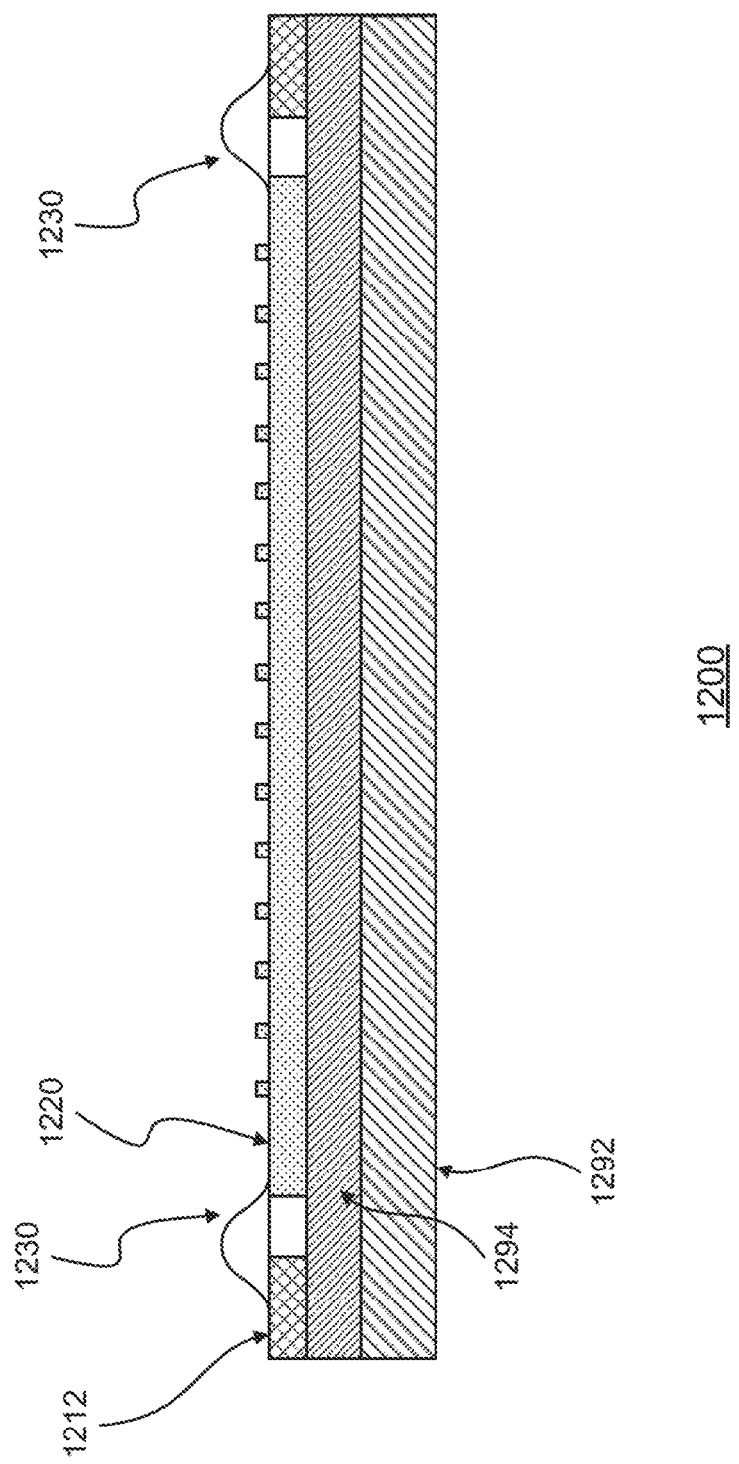
FIG. 12 illustrates a cross-sectional view of wire bonding to connect base chip and leads for a flexible IC carrier, in accordance with some embodiments of the disclosure.

FIG. 12 illustrates a cross-sectional view of wire bonding to connect base chip and leads for a flexible IC carrier, in accordance with some embodiments of the disclosure. In a scenario 1200, a leadframe panel may be attached via an adhesive 1294 to a carrier 1292, and base chips 1220 may also be attached (through empty holes of the leadframe panel) to carrier 1292 by adhesive 1294. One or more leads 1212 at the peripheral regions of pockets of leadframe panel 1210 may be separated from (e.g., not in contact with) base chips 1220.

Base chips 1220 may be connected to leads 1212 by bonding wires 1230 (e.g., in bonding portion 1110), but IC components might not yet be placed on base chip 1220.

Figure 13A:
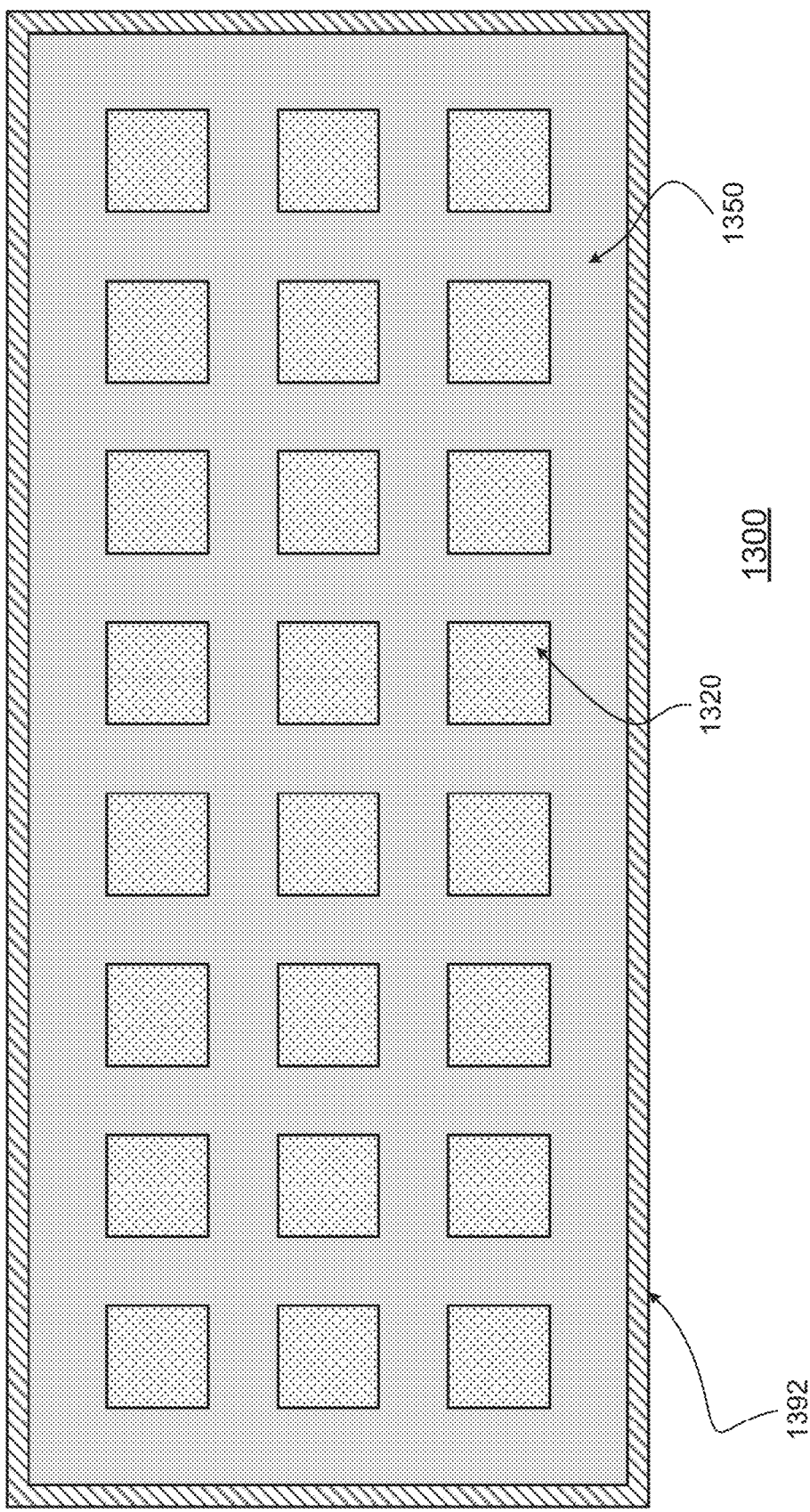
FIGS. 13A and 13B illustrates a top view and a cross-sectional view, respectively, of mold encapsulation on a leadframe panel, in accordance with some embodiments of the disclosure.
Figure 13B:
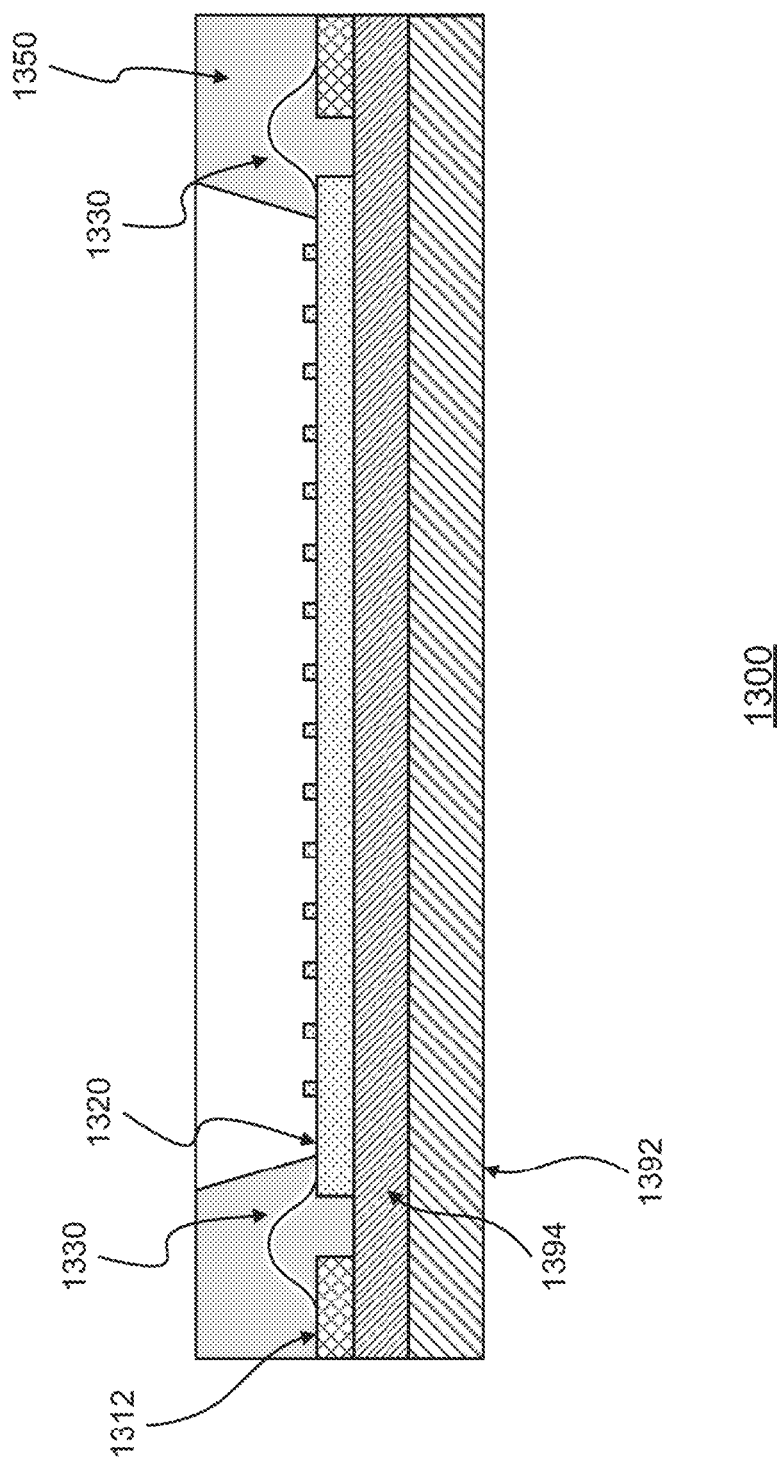

FIGS. 13A and 13B illustrates a top view and a cross-sectional view, respectively, of mold encapsulation on a leadframe panel, in accordance with some embodiments of the disclosure. In a scenario 1300, a leadframe panel may be attached via an adhesive 1394 to a carrier 1392, and base chips 1320 may also be attached (through empty holes 1314) to carrier 1392 by adhesive 1394. One or more leads 1312 at peripheral regions of pockets of the leadframe panel may be separated from (e.g., not in contact with) base chips 1320, and base chips 1320 may be connected to leads 1212 by bonding wires 1330.

A package body with an open cavity may then be built (e.g., a base die having an exposed surface), such as by encapsulating leads of the leadframe panel, bonding wires, and/or peripheral portions of the base die with a molding compound 1350 (e.g., in building portion 1112).

A base chip 1320, one or more bonding wires 1330, and one or more leads 1312 may thus be encapsulated by molding compound 1350, and an open cavity may be formed, providing a packaged module that is partially encapsulated. Accordingly, a leadframe panel may be partially encapsulated with an active area of a base chip being exposed for subsequent placement of one or more IC components (e.g., in attaching portion 1114).

In accordance with FIGS. 1-13, and respect to various embodiments, a packaged component may have a first surface and an opposite second surface (e.g., a top surface and an opposite bottom surface). The packaged component may comprise a first element (such as a lead of a leadframe), a second element (such as a base die), and a third element (such as a bonding wire). The first element may have a first surface and an opposite second surface (e.g., a top surface and an opposite bottom surface). The second element may have a first surface and an opposite second surface (e.g., a top surface and an opposite bottom surface). The third element may electrically connect a portion of the first element to a portion of the second element. The second surface of the first element may be adjacent to the second surface of the packaged component (e.g., a bottom surface of the lead may be adjacent to a bottom surface of the packaged component). The second surface of the second element may be adjacent to the second surface of the packaged component (e.g., the bottom surface of the base die may be adjacent to the bottom surface of the packaged component).

In some embodiments, the second surface of the first element and the second surface of the second element (e.g., the bottom surface of the lead and the bottom surface of the base die) may be substantially co-planar. For some embodiments, the second surface of the first element and the second surface of the second element (e.g., the bottom surface of the lead and the bottom surface of the base die) may form portions of the second surface of the packaged component.

In some embodiments, the first element may be a portion of a lead-frame. For some embodiments, the second element may be a semiconductor base chip.

For some embodiments, the packaged component may comprise a fourth element (e.g., an IC component, or chiplet) mounted on the first surface of the second element (e.g., the top surface of the base die) and electrically connected to one or more portions of the first surface of the second element. In some embodiments, the fourth element may be electrically connected to the one or more portions of the first surface of the second element through one or more respectively corresponding electrically-conductive structures (e.g., pillars or balls of conductive material between the base die and the IC component).

In some embodiments, the packaged component may comprise an encapsulating element (e.g., a molding compound) covering portions of the first element, the second element, and the third element. For some embodiments, the third element may electrically connect a portion of the first surface of the first element to a portion of the first surface of the second element (e.g., a portion of the top surface of the lead to a portion of the top surface of the base die).

With respect to a variety of embodiments, a packaged component may have a first surface and an opposite second surface (e.g., a top surface and an opposite bottom surface). The packaged component may comprise a first electrically-conductive element, a semiconductor element, and a second electrically-conductive element. The first electrically-conductive element may have a first surface and an opposite second surface (e.g., a top surface and an opposite bottom surface). The semiconductor element may have a first surface and an opposite second surface (e.g., a top surface and an opposite bottom surface). The second electrically-conductive element may connect the first electrically-conductive element to the semiconductor element. A first distance from the second (e.g., bottom) surface of the first electrically-conductive element to the first (e.g., top) surface of the first electrically-conductive element may be greater than or equal to a second distance from a plane through the second (e.g., bottom) surface of the first electrically-conductive element to a plane through the second (e.g., bottom) surface of the semiconductor element.

In some embodiments, the second (e.g., bottom) surface of the first electrically-conductive element may be adjacent to the second (e.g., bottom) surface of the packaged component, and a second (e.g., bottom) surface of the semiconductor element may be adjacent to the second (e.g., bottom) surface of the packaged component. For some embodiments, the second (e.g., bottom) surface of the first electrically-conductive element and the second (e.g., bottom) surface of the semiconductor element may be substantially co-planar. In some embodiments, the second (e.g., bottom) surface of the first electrically-conductive element and the second (e.g., bottom) surface of the semiconductor element may form portions of the second surface of the packaged component.

For some embodiments, the semiconductor element may be a first semiconductor element, and the packaged component may comprise a second semiconductor element mounted on the first (e.g., top) surface of the first semiconductor element and electrically connected to one or more portions of the first (e.g., top) surface of the first semiconductor element. In some embodiments, the second semiconductor element may be electrically connected to the one or more portions of the first (e.g., top) surface of the first semiconductor element through one or more respectively corresponding electrically-conductive structures (e.g, pillars or balls of conductive material). For some embodiments, the packaged component may comprise an encapsulating element covering portions of the first electrically-conductive element, the semiconductor element, and the second electrically-conductive element.

Although the actions in the flowchart with reference to FIGS. 1 and 11 are shown in a particular order, the order of the actions can be modified. Thus, the illustrated embodiments can be performed in a different order, and some actions may be performed in parallel. Some of the actions and/or operations listed in FIGS. 1 and 11 are optional in accordance with certain embodiments. The numbering of the actions presented is for the sake of clarity and is not intended to prescribe an order of operations in which the various actions must occur. Additionally, operations from the various flows may be utilized in a variety of combinations.

Accordingly, although various process steps may be discussed in a particular order, such orders may be varied in some embodiments, or some steps may be performed in parallel in some embodiments (unless, for example, a first step need follow a second step such that the second step must be completed before the first step begins).

In some embodiments, an apparatus may comprise means for performing various actions and/or operations of the methods of FIGS. 1 and 11.

Moreover, in some embodiments, machine readable storage media may have executable instructions that, when executed, cause one or more processors to perform an operation comprising method 100 and method 2100. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

Moreover, in some embodiments, machine readable storage media may have executable instructions that, when executed, cause one or more processors to perform an operation comprising method 100 and method 2100. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

Figure 14:
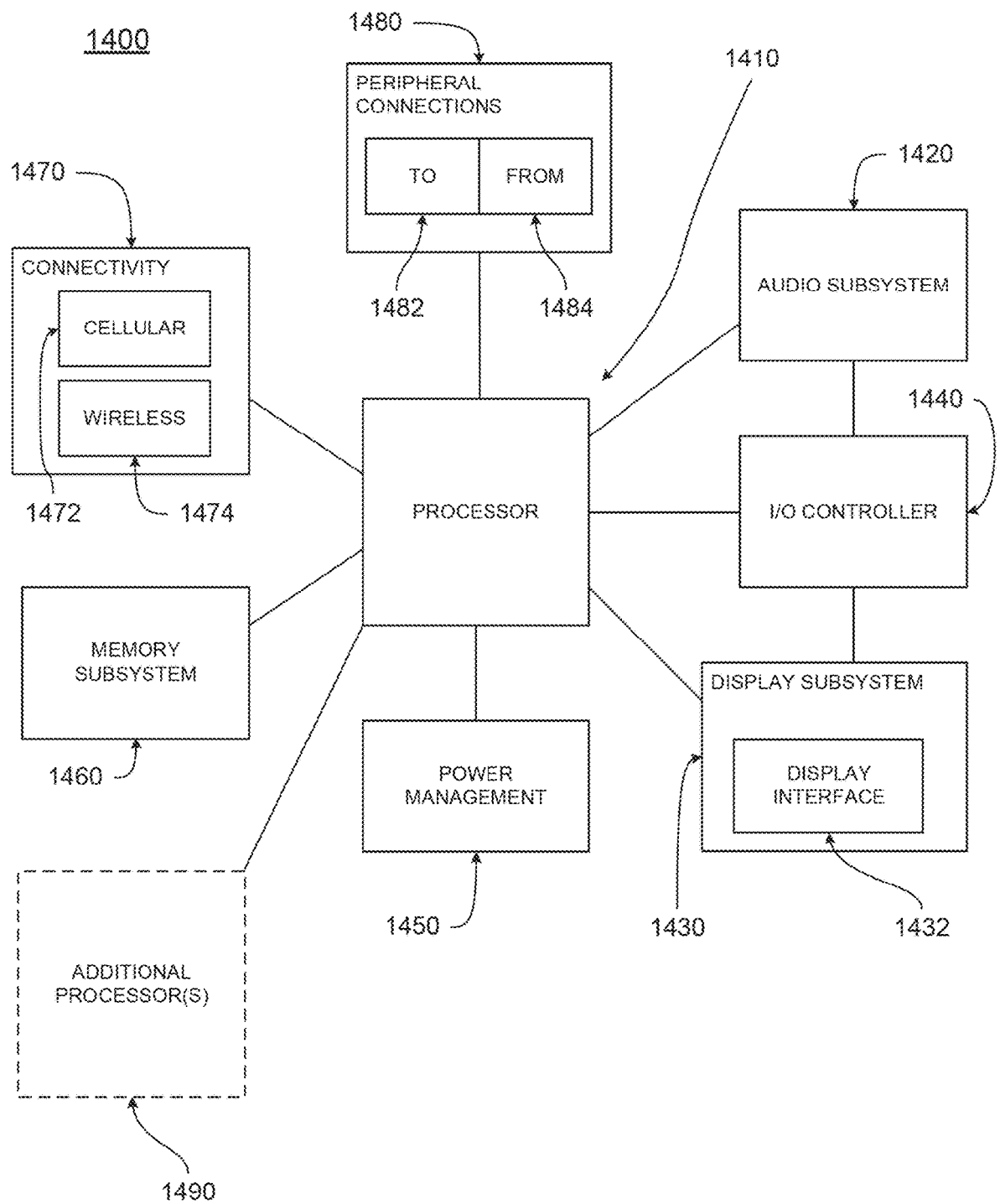
FIG. 14 illustrates a computing device with mechanisms for flexible IC packaging enabling highly integrated modules, in accordance with some embodiments of the disclosure.

FIG. 14 illustrates a computing device with mechanisms for flexible IC packaging enabling highly integrated modules, in accordance with some embodiments of the disclosure. Computing device 1400 may be a computer system, a System-on-a-Chip (SoC), a tablet, a mobile device, a smart device, an Internet-of-Things device, a wearable device, or a smart phone with mechanisms for flexible IC packaging enabling highly integrated modules, in accordance with some embodiments of the disclosure. It will be understood that certain components of computing device 1400 are shown generally, and not all components of such a device are shown FIG. 14. Moreover, while some of the components may be physically separate, others may be integrated within the same physical package, or even on the same physical silicon die. Accordingly, the separation between the various components as depicted in FIG. 14 may not be physical in some cases, but may instead be a functional separation. It is also pointed out that those elements of FIG. 14 having the same names or reference numbers as the elements of any other figure can operate or function in any manner similar to that described, but are not limited to such.

In various embodiments, the components of computing device 1400 may include any of a processor 1410, an audio subsystem 1420, a display subsystem 1430, an I/O controller 1440, a power management component 1450, a memory subsystem 1460, a connectivity component 1470, one or more peripheral connections 1480, and one or more additional processors 1490. In some embodiments, processor 1410 may include mechanisms for flexible IC packaging enabling highly integrated modules, in accordance with some embodiments of the disclosure. In various embodiments, however, any of the components of computing device 1400 may include the mechanisms for flexible IC packaging enabling highly integrated modules, in accordance with some embodiments of the disclosure. In addition, one or more components of computing device 1400 may include an interconnect fabric having a plurality of ports, such as a router, a network of routers, or a Network-on-a-Chip (NoC).

Processor 1410 may be a general-purpose processor or CPU (Central Processing Unit). In some embodiments, processor 1410 may include one or more physical devices, such as microprocessors, application processors, microcontrollers, programmable logic devices, or other processing means. The processing operations performed by processor 1410 may include the execution of an operating platform or operating system on which applications and/or device functions may then be executed. The processing operations may also include operations related to one or more of the following: audio I/O; display I/O; power management; connecting computing device 1400 to another device; and/or I/O (input/output) with a human user or with other devices.

Audio subsystem 1420 may include hardware components (e.g., audio hardware and audio circuits) and software components (e.g., drivers and/or codecs) associated with providing audio functions to computing device 1400. Audio functions can include speaker and/or headphone output as well as microphone input. Devices for such functions can be integrated into computing device 1400, or connected to computing device 1400. In one embodiment, a user interacts with computing device 1400 by providing audio commands that are received and processed by processor 1410.

Display subsystem 1430 may include hardware components (e.g., display devices) and software components (e.g., drivers) that provide a visual and/or tactile display for a user to interact with computing device 1400. Display subsystem 1430 may include a display interface 1432, which may be a particular screen or hardware device used to provide a display to a user. In one embodiment, display interface 1432 includes logic separate from processor 1410 to perform at least some processing related to the display. In some embodiments, display subsystem 1430 includes a touch screen (or touch pad) device that provides both output and input to a user.

I/O controller 1440 may include hardware devices and software components related to interaction with a user. I/O controller 1440 may be operable to manage hardware that is part of audio subsystem 1420 and/or display subsystem 1430. Additionally, I/O controller 1440 may be a connection point for additional devices that connect to computing device 1400, through which a user might interact with the system. For example, devices that can be attached to computing device 1400 might include microphone devices, speaker or stereo systems, video systems or other display devices, keyboard or keypad devices, or other I/O devices for use with specific applications such as card readers or other devices.

As mentioned above, I/O controller 1440 can interact with audio subsystem 1420 and/or display subsystem 1430. For example, input through a microphone or other audio device can provide input or commands for one or more applications or functions of computing device 1400. Additionally, audio output can be provided instead of, or in addition to, display output. In another example, if display subsystem 1430 includes a touch screen, the display device may also act as an input device, which can be at least partially managed by I/O controller 1440. There can also be additional buttons or switches on computing device 1400 to provide I/O functions managed by I/O controller 1440.

In some embodiments, I/O controller 1440 manages devices such as accelerometers, cameras, light sensors or other environmental sensors, or other hardware that can be included in computing device 1400. The input can be part of direct user interaction, and may provide environmental input to the system to influence its operations (such as filtering for noise, adjusting displays for brightness detection, applying a flash for a camera, or other features).

Power management component 1450 may include hardware components (e.g., power management devices and/or circuitry) and software components (e.g., drivers and/or firmware) associated with managing battery power usage, battery charging, and features related to power saving operation.

Memory subsystem 1460 may include one or more memory devices for storing information in computing device 1400. Memory subsystem 1460 can include nonvolatile memory devices (whose state does not change if power to the memory device is interrupted) and/or volatile memory devices (whose state is indeterminate if power to the memory device is interrupted). Memory subsystem 1460 can store application data, user data, music, photos, documents, or other data, as well as system data (whether long-term or temporary) related to the execution of the applications and functions of computing device 1400.

Some portion of memory subsystem 1460 may also be provided as a non-transitory machine-readable medium for storing the computer-executable instructions (e.g., instructions to implement any other processes discussed herein). The machine-readable medium may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, some embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity component 1470 may include a network interface, such as a cellular interface 1472 or a wireless interface 1474 (so that an embodiment of computing device 1400 may be incorporated into a wireless device such as a cellular phone or a personal digital assistant). In some embodiments, connectivity component 1470 includes hardware devices (e.g., wireless and/or wired connectors and communication hardware) and software components (e.g., drivers and/or protocol stacks) to enable computing device 1400 to communicate with external devices. Computing device 1400 could include separate devices, such as other computing devices, wireless access points or base stations, as well as peripherals such as headsets, printers, or other devices.

In some embodiments, connectivity component 1470 can include multiple different types of network interfaces, such as one or more wireless interfaces for allowing processor 1410 to communicate with another device. To generalize, computing device 1400 is illustrated with cellular interface 1472 and wireless interface 1474. Cellular interface 1472 refers generally to wireless interfaces to cellular networks provided by cellular network carriers, such as provided via GSM or variations or derivatives, CDMA (code division multiple access) or variations or derivatives, TDM (time division multiplexing) or variations or derivatives, or other cellular service standards. Wireless interface 1474 refers generally to non-cellular wireless interfaces, and can include personal area networks (such as Bluetooth, Near Field, etc.), local area networks (such as Wi-Fi), and/or wide area networks (such as WiMax), or other wireless communication.

Peripheral connections 1480 may include hardware interfaces and connectors, as well as software components (e.g., drivers and/or protocol stacks) to make peripheral connections. It will be understood that computing device 1400 could both be a peripheral device to other computing devices (via "to" 1482), as well as have peripheral devices connected to it (via "from" 1484). The computing device 1400 may have a "docking" connector to connect to other computing devices for purposes such as managing content on computing device 1400 (e.g., downloading and/or uploading, changing, synchronizing). Additionally, a docking connector can allow computing device 1400 to connect to certain peripherals that allow computing device 1400 to control content output, for example, to audiovisual or other systems.

In addition to a proprietary docking connector or other proprietary connection hardware, computing device 1400 can make peripheral connections 1480 via common or standards-based connectors. Common types of connectors can include a Universal Serial Bus (USB) connector (which can include any of a number of different hardware interfaces), a DisplayPort or MiniDisplayPort (MDP) connector, a High Definition Multimedia Interface (HDMI) connector, a Firewire connector, or other types of connectors.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to IC chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A packaged component having a first surface and an opposite second surface, the packaged component comprising:
   a first element having a first surface and an opposite second surface, wherein the first element comprises a portion of a lead-frame, wherein the lead-frame is part of a lead-frame panel which includes a plurality of pockets, wherein most of a peripheral region of an individual pocket includes a plurality of leads that extend from the lead-frame panel towards the individual pocket;
   a second element having a first surface and an opposite second surface, wherein the second element is a semiconductor base chip; and
   a third element electrically connecting a portion of the first element to a portion of the second element,
   wherein the second surface of the first element is adjacent to the second surface of the packaged component;
   wherein the second surface of the first element and the second surface of the second element are substantially co-planar;
   wherein the second surface of the second element is adjacent to the second surface of the packaged component; and
   wherein a first distance measured in a direction normal to the first surface of the first element to the second surface of the first element is greater than or equal to a second distance from a plane through the second surface of the first element to a plane through the second surface of the second element.

2. The packaged component of claim 1,
   wherein the second surface of the first element and the second surface of the second element form portions of the second surface of the packaged component.

3. The packaged component of claim 1,
   wherein the second element is a semiconductor base chip.

4. The packaged component of claim 1, comprising:
   a fourth element mounted on the first surface of the second element and electrically connected to one or more portions of the first surface of the second element.

5. The packaged component of claim 4,
   wherein the fourth element is electrically connected to the one or more portions of the first surface of the second element through one or more respectively corresponding electrically-conductive structures.

6. The packaged component of claim 1, comprising:
   an encapsulating element covering portions of the first element, the second element, and the third element.

7. The packaged component of claim 1,
   wherein the third element electrically connects a portion of the first surface of the first element to a portion of the first surface of the second element.

8. A packaged component having a first surface and an opposite second surface, the packaged component comprising:
   a first electrically-conductive element having a first surface and an opposite second surface, wherein the first electrically-conductive element comprises a portion of a lead-frame, wherein the lead-frame is part of a lead-frame panel which includes a plurality of pockets, wherein most of a peripheral region of an individual pocket includes a plurality of leads that extend from the lead-frame panel towards the individual pocket;
   a semiconductor element having a first surface and an opposite second surface; and
   a second electrically-conductive element connecting the first electrically-conductive element to the semiconductor element;
   wherein the second surface of the first electrically-conductive element and the second surface of the semiconductor element are substantially co-planar; and
   wherein a first distance from the second surface of the first electrically-conductive element to the first surface of the first electrically-conductive element is greater than or equal to a second distance from a plane through the second surface of the first electrically-conductive element to a plane through the second surface of the semiconductor element, wherein the first distance is measured in a direction normal to the first surface of the first electrically-conductive element to the second surface of the first electrically-conductive element.

9. The packaged component of claim 8,
   wherein the second surface of the first electrically-conductive element is adjacent to the second surface of the packaged component; and
   wherein the second surface of the semiconductor element is adjacent to the second surface of the packaged component.

10. The packaged component of claim 8,
    wherein the second surface of the first electrically-conductive element and the second surface of the semiconductor element form portions of the second surface of the packaged component.

11. The packaged component of claim 8, wherein the semiconductor element is a first semiconductor element, the packaged component comprising:
    a second semiconductor element mounted on the first surface of the first semiconductor element and electrically connected to one or more portions of the first surface of the first semiconductor element.

12. The packaged component of claim 11,
    wherein the second semiconductor element is electrically connected to the one or more portions of the first surface of the first semiconductor element through one or more respectively corresponding electrically-conductive structures.

13. The packaged component of claim 12, comprising:
    an encapsulating element covering portions of the first electrically-conductive element, the semiconductor element, and the second electrically-conductive element.

14. A system comprising a power source and a component coupled to the power source, the component including:
    a first element having a first surface and an opposite second surface, wherein the first element comprises a portion of a lead-frame, wherein the lead-frame is part of a lead-frame panel which includes a plurality of pockets, wherein most of a peripheral region of an individual pocket includes a plurality of leads that extend from the lead-frame panel towards the individual pocket;
    a second element having a first surface and an opposite second surface; and
    a third element electrically connecting a portion of the first element to a portion of the second element, wherein the second surface of the first element is adjacent to a second surface of the component;

wherein the second surface of the first element and the second surface of the second element are substantially co-planar;

wherein the second surface of the second element is adjacent to the second surface of the component, and wherein a first distance measured in a direction normal to the first surface of the first element to the second surface of the first element is greater than or equal to a second distance from a plane through the second surface of the first element to a plane through the second surface of the second element.

15. The system of claim 14, wherein the second surface of the first element and the second surface of the second element form portions of the second surface of the component.

16. The system of claim 14, comprising:

an encapsulating element covering portions of the first element, the second element, and the third element, wherein the second element is a semiconductor base chip; and wherein the third element electrically connects a portion of the first surface of the first element to a portion of the first surface of the second element.

17. The system of claim 14, comprising:

a fourth element mounted on the first surface of the second element and electrically connected to one or more portions of the first surface of the second element, wherein the fourth element is electrically connected to the one or more portions of the first surface of the second element through one or more respectively corresponding electrically-conductive structures.

18. The packaged component of claim 4, wherein:

a central region of the individual pocket corresponds with a hole for chip attachment;

the second element is positioned in the hole;

the second element comprises a programmable interposer which includes an integrated circuit;

the plurality of leads in the individual pocket are not in contact with the second element; and the fourth element is connected face-to-face with the second element.

19. The packaged component of claim 18, wherein:

the plurality of leads has different sizes, shapes and/or pitches;

the second element is connected to at least one lead of the plurality of leads via a bonding wire; and the bonding wire is encapsulated in a molding compound such that most of a top surface of the fourth element is free from the molding compound.

20. The packaged component of claim 1 comprises a layer of adhesive between a bottom surface of the lead-frame panel and a carrier.

* * * * *